(12) United States Patent
Chen et al.

(10) Patent No.: US 12,112,897 B2
(45) Date of Patent: Oct. 8, 2024

(54) METHODS FOR PEROVSKITE DEVICE PROCESSING BY VAPOR TRANSPORT DEPOSITION

(71) Applicant: First Solar, Inc., Tempe, AZ (US)

(72) Inventors: Le Chen, Fremont, CA (US); David Ho, Cupertino, CA (US); Xiaoping Li, San Jose, CA (US); Rick Powell, Ann Arbor, MI (US); Tze-Bin Song, Fremont, CA (US); Vera Steinmann, Menlo Park, CA (US); Aravamuthan Varadarajan, Fremont, CA (US); Dirk Weiss, Corvallis, OR (US); Gang Xiong, Santa Clara, CA (US); Zhibo Zhao, Novi, MI (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 17/801,093

(22) PCT Filed: Feb. 19, 2021

(86) PCT No.: PCT/US2021/018666
§ 371 (c)(1),
(2) Date: Aug. 19, 2022

(87) PCT Pub. No.: WO2021/168175
PCT Pub. Date: Aug. 26, 2021

(65) Prior Publication Data
US 2023/0082682 A1 Mar. 16, 2023

Related U.S. Application Data

(60) Provisional application No. 62/978,760, filed on Feb. 19, 2020.

(51) Int. Cl.
*H01G 9/00* (2006.01)
*C23C 14/06* (2006.01)
(Continued)

(52) U.S. Cl.
CPC ....... *H01G 9/0036* (2013.01); *C23C 14/0694* (2013.01); *C23C 14/228* (2013.01);
(Continued)

(58) Field of Classification Search
None
See application file for complete search history.

(56) References Cited

U.S. PATENT DOCUMENTS

| 5,945,163 A | 8/1999 | Powell et al. |
| 10,069,025 B2 | 9/2018 | Snaith et al. |

(Continued)

FOREIGN PATENT DOCUMENTS

| CN | 110400882 A | 11/2019 |
| CN | 111755607 A | 10/2020 |
| WO | 2019084125 A1 | 5/2019 |

OTHER PUBLICATIONS

Burschka et al., "Sequential deposition as a route to high-performance perovskite-sensitized solar cells", Nature, (Jul. 2013), issue 316, vol. 499.
(Continued)

*Primary Examiner* — Eli S Mekhlin
(74) *Attorney, Agent, or Firm* — MacMillan, Sobanski & Todd, LLC

(57) ABSTRACT

Structures and methods for manufacturing photovoltaic devices by forming perovskite layers and perovskite precursor layers using vapor transport deposition (VTD) are described.

12 Claims, 12 Drawing Sheets

(51) Int. Cl.
  *C23C 14/22* (2006.01)
  *C23C 14/50* (2006.01)
  *C23C 14/58* (2006.01)
  *H01G 9/20* (2006.01)
  *H10K 30/30* (2023.01)
  *H10K 30/40* (2023.01)
  *H10K 30/82* (2023.01)
  *H10K 71/16* (2023.01)
  *H10K 85/30* (2023.01)

(52) U.S. Cl.
  CPC .......... *C23C 14/50* (2013.01); *C23C 14/5806* (2013.01); *H01G 9/2009* (2013.01); *H10K 30/30* (2023.02); *H10K 30/40* (2023.02); *H10K 30/82* (2023.02); *H10K 71/164* (2023.02); *H10K 85/30* (2023.02)

(56) References Cited

U.S. PATENT DOCUMENTS

| | | | |
|---|---|---|---|
| 10,297,754 | B2 | 5/2019 | Gershon et al. |
| 10,580,585 | B2 | 3/2020 | Snaith et al. |
| 10,777,693 | B2 | 9/2020 | Snaith et al. |
| 10,930,494 | B2 | 2/2021 | Bush et al. |
| 11,189,794 | B2 | 11/2021 | Kim et al. |
| 11,527,663 | B2 | 12/2022 | Snaith et al. |
| 2006/0219177 | A1 | 10/2006 | Brcka |
| 2011/0039401 | A1 | 2/2011 | Nolan |
| 2013/0203202 | A1* | 8/2013 | Xiong ............... H01L 31/1828 438/57 |
| 2016/0108554 | A1* | 4/2016 | Koukitsu ............ C30B 25/165 117/88 |
| 2016/0322591 | A1 | 11/2016 | Seok et al. |
| 2017/0170384 | A1 | 6/2017 | Kijima et al. |
| 2017/0229249 | A1 | 8/2017 | Snaith et al. |
| 2017/0244057 | A1 | 8/2017 | Zhu et al. |
| 2018/0248118 | A1 | 8/2018 | Kwok et al. |
| 2018/0286596 | A1 | 10/2018 | Snaith et al. |
| 2019/0122828 | A1 | 4/2019 | Seo et al. |
| 2019/0211453 | A1 | 7/2019 | Qi et al. |
| 2019/0218657 | A1 | 7/2019 | Qi et al. |
| 2019/0283077 | A1 | 9/2019 | Pore et al. |
| 2020/0024733 | A1* | 1/2020 | Bulovic ............... C23C 14/243 |
| 2020/0106019 | A1 | 4/2020 | Palmstrom et al. |
| 2020/0270744 | A1 | 8/2020 | Ban et al. |
| 2020/0332408 | A1 | 10/2020 | Irwin et al. |
| 2021/0301387 | A1 | 9/2021 | Barden et al. |
| 2022/0076948 | A9 | 3/2022 | Bush et al. |

OTHER PUBLICATIONS

Liu et al., "Efficient planar heterojunction perovskite solar cells by vapour deposition", Nature, (Sep. 2013), vol. 501, pp. 395-398.

Stranks et al., "Electron-Hole Diffusion Lengths Exceeding 1 Micrometer in an Organometal Trihalide Perovskite Absorber", Science, (Oct. 2013), vol. 342, pp. 341-344.

Chen et al., "Planar heterojunction perovskite solar cells via vapor-assisted solution process," Journal of the American Chemical Society, (2014), vol. 136, pp. S1-S4.

Liu et al., "Perovskite solar cells with a planar heterojunction structure prepared using room-temperature solution processing techniques", Nature Photonics, (2014), issue 110, vol. 8, pp. 133-138.

Correa-Baena et al., "Promises and challenges of perovskite solar cells", Science, (Nov. 2017), vol. 358, pp. 739-744.

Wen et al., "Vapor transport deposition of antimony selenide thin film solar cells with 7.6% efficiency" Nature Communications, (Jun. 2018), vol. 2179, pp. 1-10.

Li et al., "Scalable fabrication of perovskite solar cells," Nat. Rev. Mater., vol. 3, Article No. 18017 (Mar. 2018).

Hoerantner et al., "High-speed Vapor Transport Deposition of Perovskite Thin Films," ACS Applied Materials & Interfaces, (Aug. 2019), vol. 11, pp. 32928-32936.

Swartwout et al., "Scalable Deposition Methods for Large-Area Production of Perovskite Thin Films," Energy & Environmental Materials, (2019), vol. 2, pp. 119-145.

Harding et al., "The growth of methylammonium lead iodide perovskites by close space vapor transport," RSC Advances, (Apr. 2020), issue 27, vol. 10, pp. 16125-16131.

Ngqoloda et al., "Controlled Deposition of Lead Iodide and Lead Chloride Thin Films by Low-Pressure Chemical Vapor Deposition," Coatings, (Dec. 2020), Issue 1208, vol. 10, pp. 1-13.

Heinze et al., "Importance of methylammonium iodide partial pressure and evaporation onset for the growth of co-evaporated methylammonium lead iodide absorbers," Scientific Reports, (Jul. 2021), pp. 1-12.

PCT International Search Report and Written Opinion, dated May 25, 2021, Application No. PCT/US2021/018666.

National Intellectual Property Administration, P.R. China, First Search Report, dated Jul. 31, 2023, Application No. 202180029423.4.

National Intellectual Property Administration, P. R. China, Office Action, dated May 25, 2024, Chinese Application No. 202180029423.4.

* cited by examiner

METHODS FOR PEROVSKITE DEVICE PROCESSING BY VAPOR TRANSPORT DEPOSITION

CROSS-REFERENCE TO RELATED APPLICATIONS

This is a national phase application of international application PCT/US2021/018666, filed on Feb. 19, 2021, and claims the benefit of U.S. Provisional Application No. 62/978,760, filed on Feb. 19, 2020, each of which is incorporated by reference in the entirety.

BACKGROUND

The present specification generally relates to photovoltaic devices, and, more specifically, to formation of perovskite absorbers and precursor layers for use in manufacturing photovoltaic devices.

Photovoltaic devices generate electrical power by converting light into electricity using semiconductor materials that exhibit the photovoltaic effect. Perovskites are a class of materials which may form an active layer in photovoltaic devices. Perovskite compounds have an $ABX_3$ structure, where A and B are cations and X is a halide. Some lead halide and tin halide perovskite compounds have been studied for use in photovoltaic devices. In these structures, the A site may be composed of organic methylammonium (MA), formamidinium (FA), or inorganic Cesium ($Cs^+$) or Rubidium ($Rb^+$) cations. The B site may be occupied by Lead ($Pb^{+2}$) or Tin ($Sn^{+2}$) cations. And the X site may be occupied by a halide, such as Iodine ($I^-$), Bromine ($BP$), or Chlorine ($Cl^-$). In a photovoltaic device, the perovskite material is positioned in contact with and between a negative charge transport layer and positive charge transport layer.

While perovskites are a promising material, efficient, reliable, and scalable production methods are lacking. Known methods for producing perovskites include vacuum evaporation, spray-coating, or spin-coating from solutions of the compositions or precursors. Methods may include single-step and multistep processes. Known methods for producing perovskite materials have significant impediments for use in manufacturing.

For example, vacuum evaporation requires high vacuum, with pressures typically lower than $1\times10^{-4}$ mbar (0.01 Pa). Co-evaporation with precise control of multiple fluxes is challenging and expensive to transfer to large-area manufacturing. The low pressure required is poorly suited to efficient manufacturing at scale, even-thickness coating over large areas is difficult to achieve, it is also less flexible, typically excluding use of particular compositions, such as formamidinium iodide (FAI), due to concerns related to corrosive damage to equipment used in high vacuum.

Solution-based methods also have drawbacks. The perovskite compound has self-assembling crystallization, which is advantageous in that low-temperature solution processing is possible. However, the crystallization rate is very high and can be difficult to control, so that it is difficult to manufacture a dense and even thin film without roughness and irregularities.

Methods of making perovskite materials may include sequentially coating to form a metal halide film, followed by application of an organic halide solution on the metal halide film to form a laminate of $BX_2$ and AX films, and then the two films are reacted to form the $ABX_3$ structure. While two-step methods have shown some improvements, the solution-based layer deposition processes result in uneven layer thicknesses and can result in incomplete reaction of the films. Using established methods, resulting films have unpredictable quality, poor uniformity over surfaces greater than a few centimeters, and may be too rough and irregular for use in efficient photovoltaic devices. In spray coating methods, solvents may produce unwanted byproducts, limit the choice of compounds, and increase drying and film formation time. Spin coating is not practical for use at scale, producing non-uniform layers over areas greater than a few square centimeters.

It would be advantageous to provide improved methods, systems, and structures for efficient and scalable large-area fabrication of perovskite absorbers and perovskite precursors in thin layers with uniform thickness, high production speed, low cost, and superior film quality.

DRAWINGS

The embodiments set forth in the drawings are illustrative and exemplary in nature and not intended to limit the subject matter defined by the claims. The following detailed description of the illustrative embodiments can be understood when read in conjunction with the following drawings, wherein like reference numerals designate identical or corresponding parts throughout the views.

FIG. 1 schematically depicts a vapor transport deposition (VTD) system.

FIG. 2 schematically depicts a cross-sectional view of the VTD system of FIG. 1.

FIG. 3 shows an abstraction of perovskite lattice structure for an example material.

FIG. 4 schematically depicts an embodiment of a photovoltaic device.

FIG. 5 schematically depicts an embodiment of a photovoltaic device.

Figure 1:
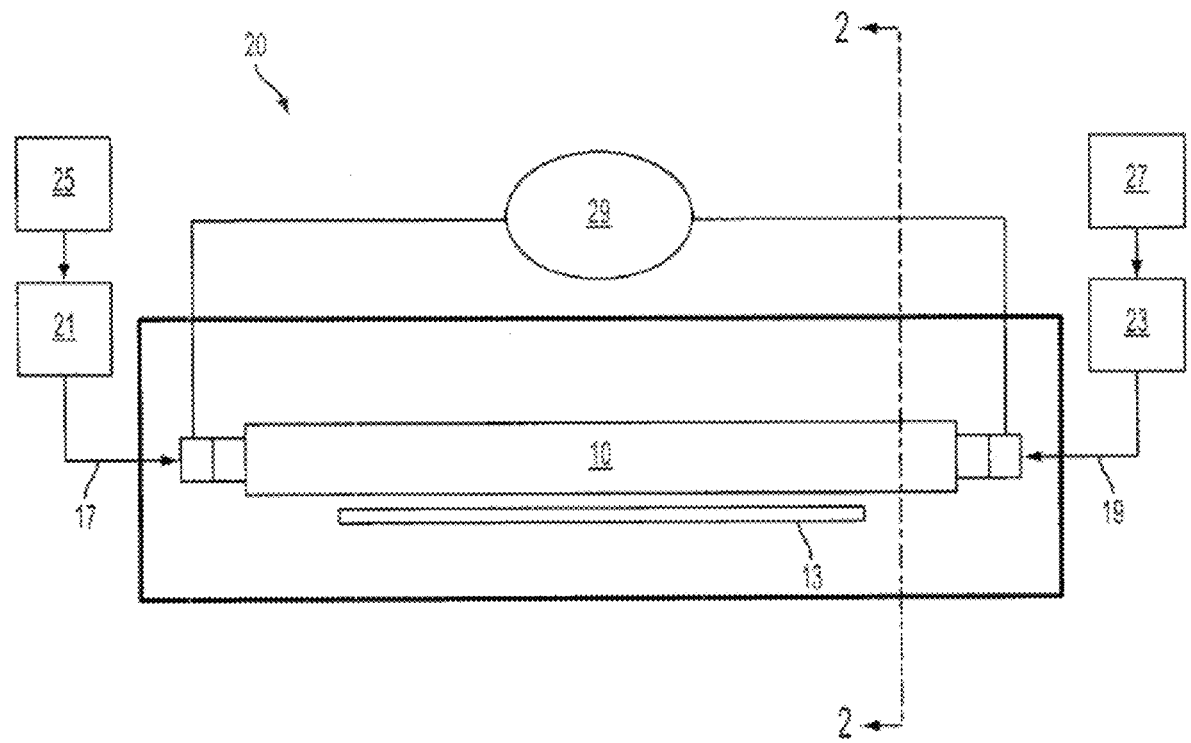

The patent or application file may contain at least one drawing executed in color and/or one or more photographs. Copies of this patent or patent application publication with color drawing(s) will be provided by the U.S. Patent Office upon request and payment of the necessary fee.

DETAILED DESCRIPTION

Embodiments provide a perovskite precursor layer of metal halide and methods of forming the perovskite precursor layer by vapor transport deposition (VTD). Perovskite precursor layers formed by described methods have improved thickness uniformity, density, and process throughput. Perovskite layers produced by described methods have improved characteristics, including: grain size, complete precursor conversion, improved thickness uniformity, and reduction or absence of pinholes and shunt defects. Also provided are methods for converting the precursor layer to a perovskite layer. Generally, the photovoltaic devices provided herein can include partly-formed or fully-formed photovoltaic modules. Various embodiments of the perovskite precursor layer, the partly-formed photovoltaic structure, and the photovoltaic device, as well as systems and methods for forming the layers, structures, and devices, will be described in more detail herein.

Photovoltaic devices may contain several material layers deposited sequentially over a substrate. Vapor deposition can be used for depositing layers over a substrate. One physical vapor deposition technique used for semiconductor material deposition is known as vapor transport deposition (VTD). VTD has been established as a reliable technique for depositing thin-film type II-VI semiconductor materials over a substrate quickly and evenly as thin solid film layers. While VTD has been established for use with some materials, such as type II-VI semiconductor materials, VTD has not been established for use with perovskite materials or forming perovskite precursor layers.

VTD processes may be performed at higher pressures than many other physical vapor deposition techniques. For example, vacuum thermal evaporation has been used to produce perovskite materials, however, such methods may require pressures below $10^{-5}$ Torr, entailing the use of equipment that is poorly suited to high-throughput manufacturing. Such equipment may also preclude use of reagents that could cause corrosion, such as some halide vapors. Advantageously, VTD processes may be performed at pressures at or above 0.1 Torr.

An example of a known VTD system is described in U.S. Pat. No. 5,945,163. In a VTD system, as shown in U.S. Pat. No. 5,945,163, a semiconductor material in a powder form is continuously supplied to the interior of a permeable vaporization chamber with the assistance of a carrier gas. The vaporization chamber is heated to a high temperature sufficient to vaporize the powder, with the vapor passing through a permeable wall of the vaporization chamber. The vapor is then directed by a distributor towards a substrate which moves past one or more orifices of the distributor which directs the vapor towards the substrate. The vapor condenses as a thin film on a surface of the substrate stack. The substrate stack includes the substrate material and previously formed layers on the substrate.

VTD systems may include one or more of: a powder delivery unit, a powder vaporizer, a vapor distributor, and a vacuum deposition unit. VTD powder vaporizers are generally designed to vaporize or sublimate raw material powder into a gaseous form. In some powder vaporizers, raw material powder from a powder delivery unit is combined with a carrier gas and injected into a vaporizer formed as a permeable heated cylinder. The material is vaporized in the cylinder and the vaporized material diffuses through the permeable walls of the vaporizer into a vapor distributor. The distributor surrounds the vaporizer cylinder and directs collected vapors towards openings which face towards a substrate for thin film material deposition on the substrate.

VTD systems may be adapted to use a granular and/or powder feedstock. In some systems, granular material is supplied through a hopper and a vibration-actuated material source is used, in which a vibration introduced by vibratory feeder causes granular and/or powder material to incrementally move from the hopper into an inclined passage. In this manner, the feedstock material is introduced into a feed tube, along with one or more carrier gases from a carrier gas source.

FIG. 1 illustrates one example of a vapor transport deposition system 20 for delivering and depositing a material, onto a substrate or substrate stack 13, for example, the substrate 13 can be a glass substrate, used in the manufacture of thin film solar modules. Inert carrier gas sources 25 and 27, for example, helium gas (He), argon gas (Ar), and/or nitrogen gas ($N_2$) sources, respectively provide a carrier gas to powder feeders 21 and 23, which contain a powder or granular material. The gas transports the powder or granular material through injector ports 17, 19 on opposite ends of a vaporizer and distributor assembly 10. The vaporizer and distributor assembly 10 vaporizes the powder and/or granular material and distributes it for deposition onto substrate stack 13.

Figure 2:
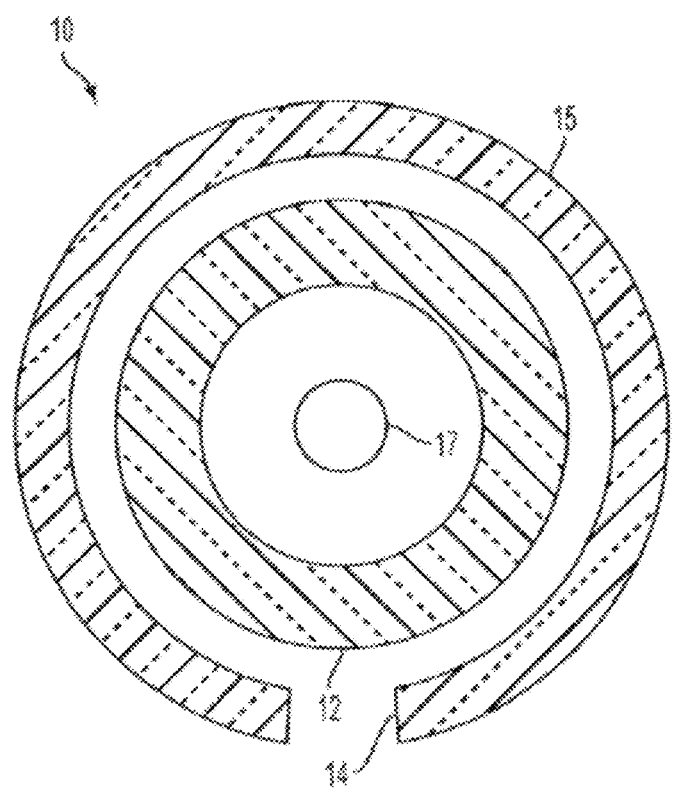

FIG. 2 is a cross-sectional view, taken along the section line 2-2 of FIG. 1, of one example of a powder vaporizer and distributor assembly 10. The vaporizer 12 is constructed as a heated tubular permeable member. It is formed of a resistive material which can be heated by an AC power source 29 and vaporizes a material powder transported by the carrier gas into vaporizer 12 through injector ports 17, 19. The distributor 15 is a housing heated by radiant heat from vaporizer 12 and/or from another source. The housing of distributor 15 surrounds vaporizer 12 to capture material vapor that diffuses through the walls of vaporizer 12. The semiconductor material vapor is directed by a distributor towards a slot or series of holes 14 which face a surface of a substrate 13, which moves past the vaporizer and distributor assembly 10. More detailed examples of VTD systems of the type illustrated can be found in, for example, U.S. Pat. Nos. 5,945,163, 5,945,165, 6,037,241, 7,780,787, and 8,382,901.

Temperatures used for VTD deposition may be in a range of from about 200° C. to about 1200° C. The vaporizer 12 can be formed as a heatable tubular permeable member formed of graphite or silicon carbide (SiC). The distributor 15 can be formed of a shroud of ceramic material, such as mullite. Vapor deposition occurs within a housing which contains a substrate transport mechanism such as driven rollers. Ceramic sheets may also be used as heat shields within the housing.

The VTD processing system can process a substrate (for example, a glass sheet or a glass sheet coated with one or more thin films) for deposition of a material. The system can include a housing defining a processing chamber in which a material is deposited on the substrate. The housing may include an entry station and an exit station. The entry station and exit station can be constructed as load locks or as slit seals through which the substrates enter and exit the processing chamber. The interior of the housing can be heated to a desired processing temperature and maintained at a processing pressure.

The VTD processing system can include a distributor assembly. The distributor assembly can be located above a conveyor so as to deposit the material on an upwardly facing surface of the substrate. The conveyor can be of the roll type including rolls that support a downwardly facing surface of the substrate for its conveyance during processing. The distributor assembly can be used with a vacuum drawn in the processing chamber such as, for example, in the range of about 0.1 to 50 Torr or about 10 to 6600 Pa. Accordingly, the processing system can include a suitable exhaust pump for exhausting the processing chamber of the housing both initially and continuously thereafter to remove carrier gases and secondary gases.

Embodiments of the distributor assembly can include a manifold, at least one vaporizer, and at least one heater. The distributor assembly can include a manifold configured to distribute semiconductor vapor along a vapor curtain. The vaporizer can be supported on, attached to, or otherwise in fluid communication with, the manifold, and configured to vaporize a powder or granular material for deposition. The heater can also be supported on, attached to, or otherwise in thermal communication with the manifold, and configured to heat at least a portion of the manifold. The manifold generally includes at least one slot or nozzle (a "nozzle" may also be referred to as a "jet") configured to direct vaporized semiconductor material onto passing substrates, which can be transported along a path underneath the distributor assembly on a rolling conveyor or the like.

In some embodiments, the distributor assembly allows for large scale deposition by providing a vapor curtain greater than 1 m in size. In some embodiments, the vapor curtain width is between 1 to 2 m, or about 1.2 m. In some embodiments, the distributor assembly achieves deposition rates of about 0.5 microns per second, about 1.0 microns per second, or about 1.5 microns per second.

Manufacturing of a photovoltaic device may include sequentially disposing functional layers or layer precursors in a "stack" of layers through one or more deposition processes, including, but not limited to, sputtering, spray, evaporation, molecular beam deposition, pyrolysis, closed space sublimation (CSS), pulse laser deposition (PLD), chemical vapor deposition (CVD), electrochemical deposition (ECD), atomic layer deposition (ALD), or vapor transport deposition (VTD). In some embodiments, VTD may be preferred for greater throughput speed and quality.

Manufacturing of photovoltaic devices can further include the selective removal of portions of certain layers of the stack of layers, such as by scribing, to divide the photovoltaic device into a plurality of photovoltaic cells.

Figure 3:
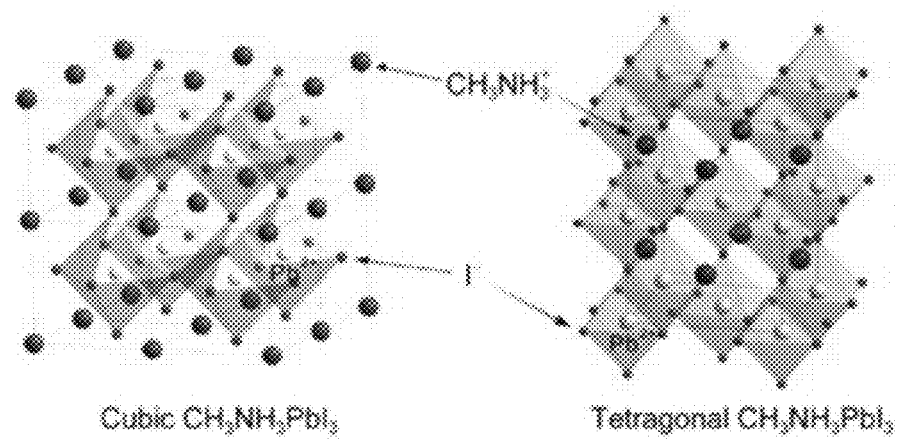

Referring now to FIG. 3, perovskite compounds have an $ABX_3$ structure, where A and B are cations and X is a halogen anion. Specific materials and compounds have been studied for use in photovoltaic devices. In these perovskite structures, the A site may be occupied by one or more of MA, FA, Cs, or Rb. The B site may be occupied by one or more of Pb, Sn, or Ge. And the X site may be occupied by one or more of I, Br, or Cl.

Organic-inorganic or inorganic metal halide perovskite materials can be used to absorb light energy in photovoltaic devices. In a photovoltaic device, the perovskite material is positioned in contact with and between a negative charge transport layer and positive charge transport layer. Perovskite photovoltaic devices may be configured in either a N-I-P or P-I-N orientation, with either the negative or positive charge transport layer towards the light-incident side of the device.

Figure 4:
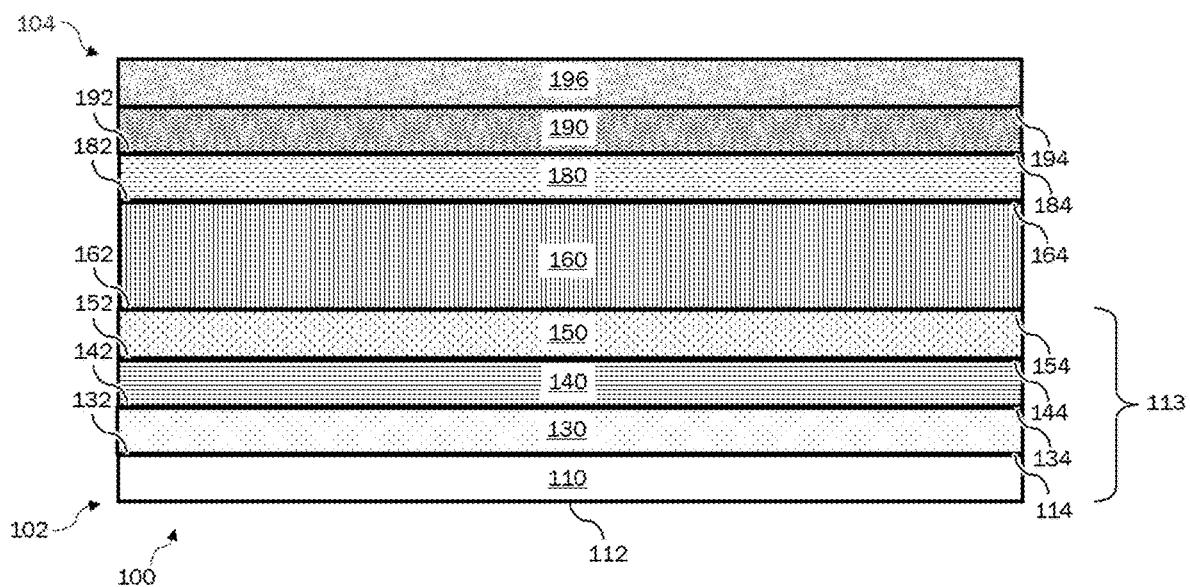

FIG. 4 shows an example device structure for a perovskite photovoltaic device. In the depicted example, the negative charge transport layer is proximate the light-incident side of the device.

Referring now to FIG. 4, an embodiment of a photovoltaic device 100 is schematically depicted. The photovoltaic device 100 can be configured to receive light and transform light into electrical signals, e.g., photons can be absorbed from the light and transformed into electrical signals via the photovoltaic effect. Accordingly, the photovoltaic device 100 can define an energy, light-incident, or front side 102 configured to be exposed to a light source such as, for example, the sun. The photovoltaic device 100 can also define an opposing side 104 offset from the light-incident side 102 such as, for example, by a plurality of material layers. It is noted that the term "light" can refer to various wavelengths of the electromagnetic spectrum such as, but not limited to, wavelengths in the ultraviolet (UV), infrared (IR), and visible portions of the electromagnetic spectrum. "Sunlight," as used herein, refers to light emitted by the sun.

The photovoltaic device 100 can include a plurality of layers disposed between the light-incident front side 102 and the opposing side 104. As used herein, the term "layer" refers to a thickness of material provided upon a surface. Each layer can cover all or any portion of the surface. In some embodiments, the layers of the photovoltaic device 100 can be divided into an array of photovoltaic cells. For example, the photovoltaic device 100 can be scribed according to a plurality of serial scribes and a plurality of parallel scribes.

The layers of the photovoltaic device 100 can include a substrate 110 configured to facilitate the transmission of light into the photovoltaic device 100. The substrate 110 can be disposed at the front side 102 of the photovoltaic device 100. The substrate 110 can have a first surface 112 substantially facing the energy side 102 of the photovoltaic device 100 and a second surface 114 substantially facing the opposing side 104 of the photovoltaic device 100. One or more layers of material can be disposed between the first surface 112 and the second surface 114 of the substrate 110.

The substrate 110 can be substantially transparent. In some embodiments, the substrate comprises a substantially transparent material such as, for example, glass. Suitable glass can include soda-lime glass, a glass with reduced iron content, or a glass with about 90% transmittance. Optionally, the substrate 110 can include a performance coating applied to form the exterior or light-facing surface. The performance coating can be configured to interact with light or to improve durability of the substrate 110 such as, but not limited to, an antireflective coating, an antisoiling coating, or a combination thereof.

The photovoltaic device 100 can optionally include a barrier layer 130 configured to mitigate diffusion of contaminants from the substrate 110, which could result in degradation or delamination. The barrier layer 130 can have a first surface 132 substantially facing the front side 102 of the photovoltaic device 100 and a second surface 134 substantially facing the opposing side 104 of the photovoltaic device 100. In some embodiments, the barrier layer 130 can be provided adjacent to the substrate 110. For example, the first surface 132 of the barrier layer 130 can be provided upon the second surface 114 of the substrate 100. The phrase "adjacent to," as used herein, means that two layers are disposed contiguously and without any intervening materials between at least a portion of the layers.

Generally, the barrier layer 130 can be substantially transparent, thermally stable, with a reduced number of pin holes and having sodium-blocking capability, and good adhesive properties. Alternatively or additionally, the barrier layer 130 can be configured to apply color suppression to light. The barrier layer 130 can include one or more layers of suitable material, including, but not limited to, tin oxide, silicon dioxide, aluminum-doped silicon oxide, silicon oxide, silicon nitride, or aluminum oxide. The barrier layer 130 can have any suitable thickness bounded by the first surface 132 and the second surface 134, including, for example, more than about 100 Å in one embodiment, more than about 150 Å in another embodiment, or less than about 200 Å in a further embodiment.

The photovoltaic device 100 can include a transparent electrode layer 140 configured to provide electrical contact to transport charge carriers generated by the photovoltaic device 100. The transparent electrode layer 140 can have a first surface 142 substantially facing the energy side 102 of the photovoltaic device 100 and a second surface 144 substantially facing the opposing side 104 of the photovoltaic device 100. In some embodiments, the transparent electrode layer 140 can be provided adjacent to the barrier layer 130. For example, the first surface 142 of the transparent electrode layer 140 can be provided upon the second surface 134 of the barrier layer 130. Generally, the transparent electrode layer 140 can be formed from one or more layers of n-type semiconductor material that is substantially transparent and has a wide band gap. Specifically, the wide band gap can have a larger energy value compared to the energy of the photons of the light, which can mitigate undesired absorption of light. The transparent electrode layer 140 can include one or more layers of suitable material, including, but not limited to, tin dioxide, doped tin dioxide (e.g., F—$SnO_2$), indium tin oxide, or cadmium stannate.

The photovoltaic device 100 can include an electron transport layer (ETL) 150. The electron transport layer (ETL) may also be called a negative charge transport layer, a n-type contact, an e⁻ selective contact, or an electron-selective layer. It may be positioned in contact with the transparent electrode which functions as an anode. The ETL 150 can have a first surface 152 substantially facing the front side 102 of the photovoltaic device 100 and a second surface 154 substantially facing the opposing side 104 of the photovoltaic device 100. In some embodiments, the ETL 150 can be provided adjacent to the transparent electrode layer 140. For example, the first surface 152 of the ETL 150 can be provided upon the second surface 144 of the transparent electrode layer 140. The ETL 150 may have any suitable thickness between the first surface 152 and the second surface 154, including, for example, more than about 2 nm in one embodiment, between about 10 nm and about 80 nm in another embodiment, or between about 15 nm and about 60 nm in a further embodiment. The ETL can include one or more layers of suitable material, including, but not limited to, PCBM (phenyl-C61-butyric acid methyl ester), C60, BCP (bathocuproine), lithium fluoride (LiF), or metal oxides, such as $TiO_2$, ZnO, $SnO_x$, $ZnSnO_4$, or $SrTiO_3$. In some embodiments the ETL 150 comprises tin oxide ($SnO_2$).

A partly formed device, including a substrate 110, an ETL 150, and layers therebetween, may be referred to as a substrate stack 113.

The photovoltaic device 100 can include an absorber layer 160 comprising a perovskite material configured to cooperate with adjacent layers and form a P-I-N junction within the photovoltaic device 100. Accordingly, absorbed photons of the light can free electron-hole pairs and generate carrier flow, which can yield electrical power.

Lead halide and tin halide perovskite compounds may be used in an absorber layer of a photovoltaic device. The metal halide perovskite compounds have an $ABX_3$ structure, where A and B are cations and X is a halogen anion. In examples, the A site may be occupied by one or more organic or inorganic cations. For example, the A site may be composed of one or more of: methylammonium (MA), formamidinium (FA), cesium (Cs), or rubidium (Rb) cations. The B site may be occupied by one or more metals, such as lead (Pb) or tin (Sb). And the X site may be occupied by one or more halides, such as iodine (I), bromine (Br), or chlorine (Cl). The perovskite absorber layer may be formed by selecting and reacting one or more A-type cations or A-X-type compounds with one or more B-X compounds. Metal halide materials suitable for use as a B-X compound in forming a perovskite compound for an absorber layer include iodides, bromides, and/or chlorides, in combination with a metal, alkali metal and/or combinations thereof. In some embodiments, the B-X material is a group 14 metal salt. Metal halide or B-X materials suitable for use in a perovskite compound include, but are not limited to, lead iodide ($PbI_2$), cesium iodide (CsI), lead bromide ($PbBr_2$), cesium bromide (CsBr), cesium lead iodide ($CsPbI_3$), cesium tin iodide ($CsSnI_3$), lead chloride ($PbCl_2$), tin iodide ($SnI_2$), tin bromide ($SnBr_2$), and/or tin chloride ($SnCl_2$). In a photovoltaic device, an absorber layer of perovskite material may be positioned in contact with and between a negative charge transport layer and positive charge transport layer.

The absorber layer 160 can have a first surface 162 substantially facing the energy side 102 of the photovoltaic device 100 and a second surface 164 substantially facing the opposing side 104 of the photovoltaic device 100. A thickness of the absorber layer 160 can be defined between the first surface 162 and the second surface 164.

In an example device, the thickness of the absorber layer 160 can be between about 150 nm to 10000 nm, such as, for example, between 500 nm to 10000 nm in an embodiment, between 1000 nm to 7000 nm in an embodiment, between 200 nm to 6000 nm in an embodiment, between 300 nm to 3000 nm in an embodiment, between 400 nm to 2000 nm in an embodiment, between 400 nm to 1500 nm in an embodiment, or between 1500 nm to 4000 nm in another embodiment. In the embodiment shown in FIG. 4, the absorber layer 160 is adjacent to the ETL 150 and to a hole transport layer.

The hole transport layer (HTL) 180 may also be called a positive charge transport layer, p-type transport layer, hole transport material, h⁺ selective contact, or a hole-selective layer. It may be positioned in contact with a conducting layer or back electrode which functions as a cathode. The HTL 180 provides electrical contact to the absorber layer 160. The HTL 180 can have a first surface 182 substantially facing the front side 102 of the photovoltaic device 100 and a second surface 184 substantially facing the opposing side 104 of the photovoltaic device 100. A thickness of the HTL 180 can be defined between the first surface 182 and the second surface 184. The thickness of the HTL 180 can be between about 5 nm to about 200 nm such as, for example, between about 10 nm to about 50 nm in one embodiment. In the embodiment shown, the HTL 180 is provided adjacent to the absorber layer 160. For example, the first surface 182 of the HTL 180 is provided upon the second surface 164 of the absorber layer 160.

In some embodiments, the HTL 180 can include a metal oxide, a polymer, a small molecule, or an organic hole transport material. In some embodiments, a hole transport material may include one or more of: nickel oxide ($NiO_x$), copper thiocyanate (CuSCN), copper phthalocyanine (CuPc), tungsten oxide ($WO_3$), copper iodide (CuI), or copper oxide ($CuO_x$). In some embodiments, the HTL 180 may consist essentially of nickel oxide ($NiO_x$). In some embodiments, the HTL 180 can include an organic compound, such as 2,2',7,7'-Tetrakis [N,N-di (4-methoxyphenyl) amino]-9,9'-spirobifluorene (Spiro-OMeTAD). The CAS number for Spiro-OMeTAD is 207739-72-8. In some embodiments, the HTL 180 may include one or more of:

Spiro-OMeTAD, PTAA (poly-triarylamine or Poly[bis(4-phenyl)(2,4,6-trimethylphenyl)amine]), PEDOT:PSS (Poly (3,4-ethylenedioxythiophene)-poly(styrenesulfonate)), P3HT (Poly(3-hexylthiophene-2,5-diyl)), P3HT-COOH (poly[3-(6-carboxyhexyl)thiophene-2,5-diyl]), or poly-TPD (4-butyl-N,N-diphenylaniline homopolymer).

The photovoltaic device 100 can include a conducting layer or back electrode 190. The conducting layer 190 can have a first surface 192 substantially facing the energy side 102 of the photovoltaic device 100 and a second surface 194 substantially facing the opposing side 104 of the photovoltaic device 100. In some embodiments, the back electrode 190 can be provided adjacent to the HTL 180. For example, the first surface 192 of the conducting layer 190 can be provided upon the second surface 184 of the HTL 180. The conducting layer 190 can include a conducting material such as, for example, one or more layers of nitrogen-containing metal, silver, nickel, copper, aluminum, titanium, palladium, chrome, molybdenum, gold, or the like. Examples of a nitrogen-containing metal layer can include aluminum nitride, nickel nitride, titanium nitride, tungsten nitride, selenium nitride, tantalum nitride, or vanadium nitride.

The photovoltaic device 100 can include a back support 196 configured to cooperate with the substrate 110 to form a housing for the photovoltaic device 100. The back support 196 can be disposed at the opposing side 102 of the photovoltaic device 100. For example, the back support 196 can be formed adjacent to the back electrode 190. The back support 196 can include any suitable material, including, for example, glass (e.g., soda-lime glass). In some embodiments, an encapsulation layer can also function as the back support 196.

The photovoltaic device 100 can optionally include one or more interlayers and/or one or more buffer layers. A buffer layer can be configured to provide an insulating layer between adjacent layers. The buffer layer may include material having higher resistivity than an adjacent layer, and may include, but is not limited to, intrinsic tin dioxide, zinc magnesium oxide (e.g., $Zn_{1-x}Mg_xO$), tin dioxide ($SnO_2$), silicon dioxide ($SiO_2$), aluminum oxide ($Al_2O_3$), aluminum nitride (AlN), zinc tin oxide, zinc oxide, tin silicon oxide, or combinations thereof. In some embodiments, the material of the buffer layer can be configured to substantially match the band gap of an adjacent semiconductor layer. The buffer layer may have a thickness, including, for example, more than about 10 nm in one embodiment, between about 10 nm and about 80 nm in another embodiment, or in a range of 15 nm to 60 nm in a further embodiment.

In some embodiments, the N-I-P structure is reversed to a P-I-N orientation in which a positive charge transport layer is proximate to the front side relative to a negative charge transport layer. In some embodiments, selected layers, including an HTL, a perovskite absorber, and an ETL, are included in a tandem device. In methods for forming a tandem device, the methods for forming the perovskite layer may include forming the perovskite layer over a contact layer of a substrate stack wherein the substrate stack comprises a cell stack and a tunnel junction.

Figure 5:
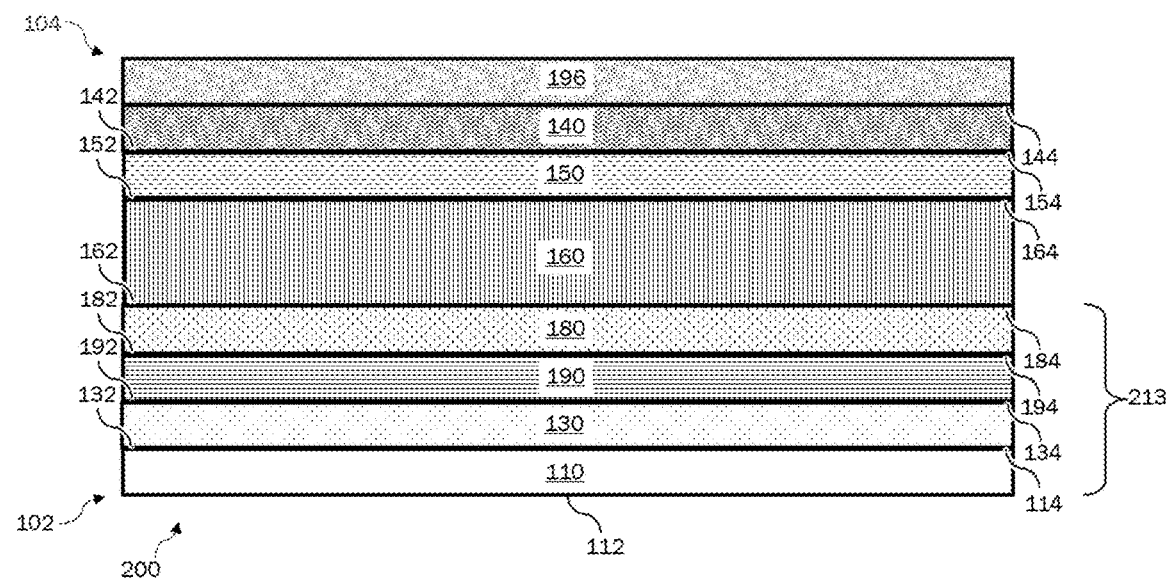

FIG. 5 shows an example device 200 with a P-I-N orientation. The layers are the same as described with respect to FIG. 4, but may be positioned as shown in FIG. 5. A partly formed device, including a substrate 110, an HTL 180, and layers therebetween, may be referred to as a substrate stack 213.

The layer of the substrate stack opposite the substrate may be referred to as a first contact layer or first charge transport layer. The first charge transport layer of the substrate stack is equivalent to the HTL in a device with P-I-N orientation, or the ETL for a device with N-I-P orientation. As used herein, the substrate stack (13, 113, 213) does not include an absorber layer. In a fully-formed device, an absorber layer is disposed between the first charge transport layer and a second charge transport layer, the second charge transport layer having a charge opposite to the first charge transport layer.

Figure 6:
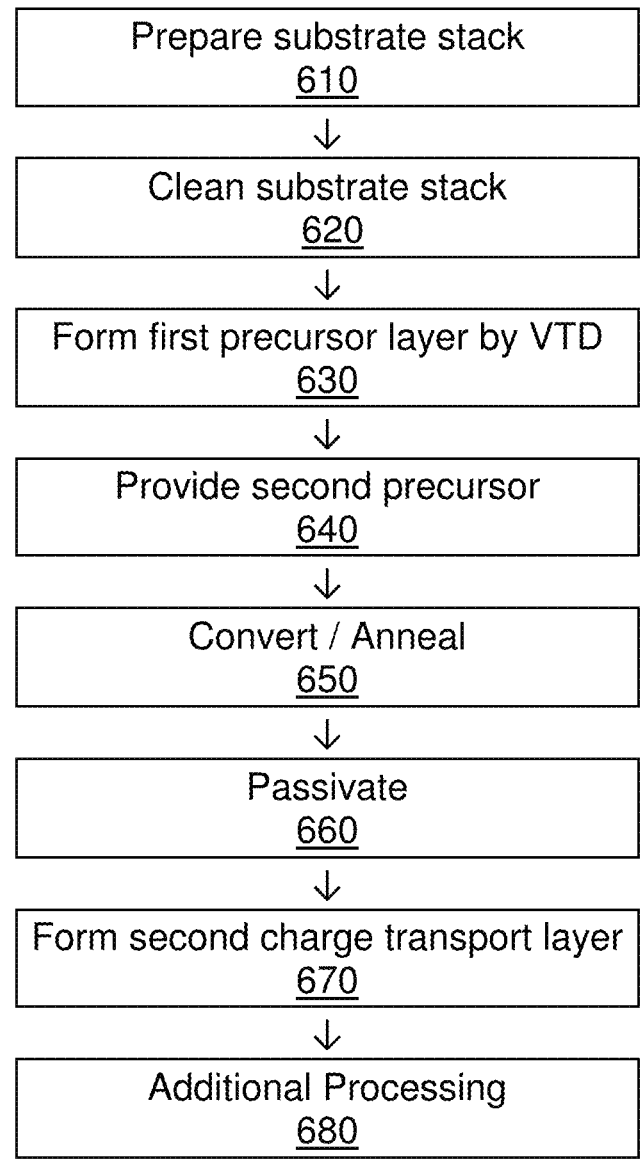
FIG. 6 shows a flow chart for an example method.

Turning now to FIG. 6, an overview of an example process flow for forming a photovoltaic device is shown.

A substrate stack is formed and prepared 610. The substrate may be formed of a transparent support, such as glass, with a transparent electrode and a first charge transport layer, such as an HTL or ETL, over the transparent support. Optionally, the substrate stack may further include a first scribe set, and one or more additional layers, such as a buffer layer, a high resistance layer, or an antireflective layer.

The substrate stack may optionally be cleaned 620. The substrate stack may be cleaned with a fluid, such as a solvent or a gas. For example, the substrate stack may be cleaned with UV ozone, or a plasma.

A first perovskite-forming composition, such as a lead halide or a tin halide, is deposited onto the electron-transporting material of the substrate stack to form a precursor layer by VTD 630. For deposition of the first perovskite-forming composition, the substrate may be conveyed into a deposition chamber. Temperature and pressure in the deposition chamber may be controlled during the deposition process.

In an example process, the deposition chamber temperature is in a range of 20° C. to 150° C. and at a pressure of in a range of 0.1 Torr to 5 Torr. The deposition chamber may have an atmosphere comprising an inert carrier gas or a combination of air and an inert gas. A first source material may include a metal halide source, such as a lead halide or a tin halide, heated to a temperature in a range of 375° C. to 550° C. The first source material may be transported towards the substrate using a carrier gas. The carrier gas may be inert. The carrier gas may comprise one or more of helium, nitrogen, or argon. The first precursor layer may be $PbI_2$, $SnI_2$, $PbBr_2$, $SnBr_2$, or combinations thereof. The vaporized source material carried by the carrier gas may pass through a manifold positioned proximate to a substrate path. The manifold directs the vaporized source material to be deposited across a width of a substrate, substantially perpendicular to the substrate path, as the substrate is conveyed past the manifold. The substrate may be conveyed continuously along the substrate path such that a substantially even thickness of the first precursor material is deposited in a continuous layer adjacent a first charge transport layer of the substrate stack. In some embodiments, the first perovskite-forming composition is deposited simultaneously along a substrate width, to a thickness of 100-2000 nm. In an example, a substrate width is in a range of one to two meters.

The substrate stack with the precursor layer coating is then exposed to a second perovskite-forming precursor composition 640. The second precursor composition may include, for example, a liquid or vapor of MAI, FAI and/or other perovskite-forming compounds.

The substrate stack with the first perovskite-forming composition is exposed to a reactant comprising a second perovskite-forming composition, and annealed to react and convert the first precursor layer to a perovskite layer 650. The steps of providing the second perovskite-forming precursor composition 640 and converting the first precursor layer to a perovskite layer 650 may be performed simultaneously or in sequence.

In an example, the first precursor layer is contacted with a second perovskite-forming composition during an annealing process.

In an example, the first precursor layer is exposed to a second perovskite-forming composition by spray coating a second precursor layer onto the first precursor layer.

In an example, the first precursor layer is exposed to a second perovskite-forming composition by depositing a second precursor layer by vapor transport deposition.

The annealing process may include controlling temperature, humidity, pressure, reactant concentration, reactant exposure time, and heating duration. In some embodiments, one or more dopants may be incorporated during the annealing process.

In an example annealing process, a surface of a transfer plate, having dimensions corresponding to the length and width of the substrate, is coated with methylammonium iodide (MAI) dissolved in a solvent of isopropyl alcohol and dried to evaporate the solvent. The transfer plate coated with MAI is positioned adjacent to the first precursor layer on a surface of the substrate stack, with a distance between the transfer plate and precursor layer in a range of 0.5 to 10 centimeters. The transfer plate is heated to a range of 75-125 C for a period of 20-120 minutes, vaporizing the MAI from the transfer plate and exposing the first precursor layer to a MAI vapor. The annealing process may be performed in an annealing chamber.

After formation of the perovskite material, the perovskite layer may optionally be passivated 660.

A second charge transport layer, such as an ETL or HTL, having a charge opposite to the first charge transport layer, is formed 670 over the perovskite absorber layer. A diffusion barrier or moisture barrier layer may be formed. The substrate stack with the perovskite layer and HTL may be processed by additional processing steps 680. Additional processing steps may include one or more of: the formation of additional layers, cleaning, scribing, encapsulating, or applying bussing connections. The substrate stack with the perovskite layer and second charge transport layer may optionally be scribed to form another scribe set, for example by a laser. A conducting layer or back electrode may be formed over the second charge transport layer. The substrate stack with the conducting layer may scribed to form a back scribe set. An encapsulation layer may be applied over the completed layer stack. Bussing or other electrical connections and a back support may be added to the device.

An intermediate structure for a perovskite photovoltaic device, formed by example methods, has a well-structured precursor layer prior to annealing and conversion of the precursor layer to a perovskite absorber layer. This precursor layer structure produces a dense perovskite coating with well-defined, contiguous, perovskite grain structures contributing to reliable and efficient photovoltaic power conversion.

The first precursor layer comprises a metal halide material disposed in a layer over the charge transport layer. Metal halide materials suitable for use in a perovskite compound include iodides, bromides, and/or chlorides, in combination with a metal, alkali metal and/or combinations thereof. Metal halide materials suitable for use in a perovskite compound include, but are not limited to, lead iodide ($PbI_2$), lead bromide ($PbBr_2$), cesium bromide (CsBr), cesium lead iodide ($CsPbI_3$), cesium tin iodide ($CsSnI_3$), lead chloride ($PbCl_2$), tin iodide ($SnI_2$), tin bromide ($SnBr_2$), and/or tin chloride ($SnCl_2$).

Using the described methods, a precursor layer with advantageous features may be prepared reliably and efficiently, using processes suitable for manufacturing photovoltaic panels. To facilitate efficient conversion, the deposited metal halide has a high porosity. Among other methods, porosity may be assessed using a scanning electron microscope (SEM) to produce three-dimensional measurements from which void ratio may be determined. Films produced by the described methods may have a porosity around 50%. In an example, the precursor layer has a porosity of about 50%. In an example, the precursor layer has a porosity in a range from 35% to 65%, in a range from 40% to 60%, and/or in a range from 45% to 55%.

The precursor layer may have densely-packed petal-like crystal grain structures oriented such that the height, substantially normal to the surface of the substrate stack, of a majority of the petal-like crystal grain structures is substantially greater than a cross-sectional grain width parallel to the substrate stack. The precursor layer may have a substantially uniform and dense lawn-like layer of the crystal grain structures. The layer may provide sufficient material to produce an absorber layer without pinholes or gaps. The layer may provide a favorable surface to volume ratio to promote complete reaction with the second precursor layer with no unreacted metal halide material. In an example precursor layer, at least a third of grains of the precursor layer have a height that is in a range of 200 nm to 500 nm and a cross-sectional grain width dimension that is less than 50 nm.

In an example, the precursor layer comprises a plurality of lead iodide crystal grain structures having a height, normal to the surface of the substrate stack, and a width, parallel to the surface of the substrate stack, and at least a quarter of grain structures of the precursor layer have a height that is in a range of 200 nm to 700 nm and a width that is less than 100 nm.

VTD of $PbI_2$ at Selected Temperatures.

A set of sample substrate stacks were prepared. The sample substrate stacks were then placed in a VTD chamber. Lead Iodide ($PbI_2$) was used as a source material for the first precursor layer. The source material was heated to a selected temperature of about 300 C, 350 C, 400 C, 450 C, 500 C, and 600 C. The chamber temperature was maintained at a temperature below the heated source material. The substrate temperature was at or below the chamber temperature. A carrier gas comprising helium directed vaporized $PBI_2$ toward the substrate. The $PbI_2$ was deposited to a thickness of 100 to 1000 nm. Resulting films were evaluated qualitatively. The quality of the films produced in this example was found to have more favorable qualities at temperatures nearer the middle of the tested ranges.

Additional temperature testing was performed for a range of pressure levels and carrier gas flow rates. Experimental results showed layer formation for a metal halide source heated to a temperature in a range of 375° C. to 550° C. for deposition within a deposition chamber having a pressure in a range of 0.1 to 2.0 Torr and using a carrier gas comprising a noble gas. Under the experimental conditions, layer quality was improved for layers produced from a source heated to a temperature within a range of 400° C. to 525° C.

VTD of $PbI_2$ at Selected Pressures and Deposition Rates.

Turning to FIGS. 7-10, precursor films were prepared at selected pressures and deposition rates. A set of sample substrate stacks were prepared. Each sample substrate stack was placed into a VTD chamber. Lead Iodide ($PbI_2$) powder was used as a source material for the first perovskite precursor layer. The source material was heated to above 400° C. The chamber temperature was maintained in a range of about 25° C. to 100° C. The substrate temperature was at or below the chamber temperature.

Figure 7:
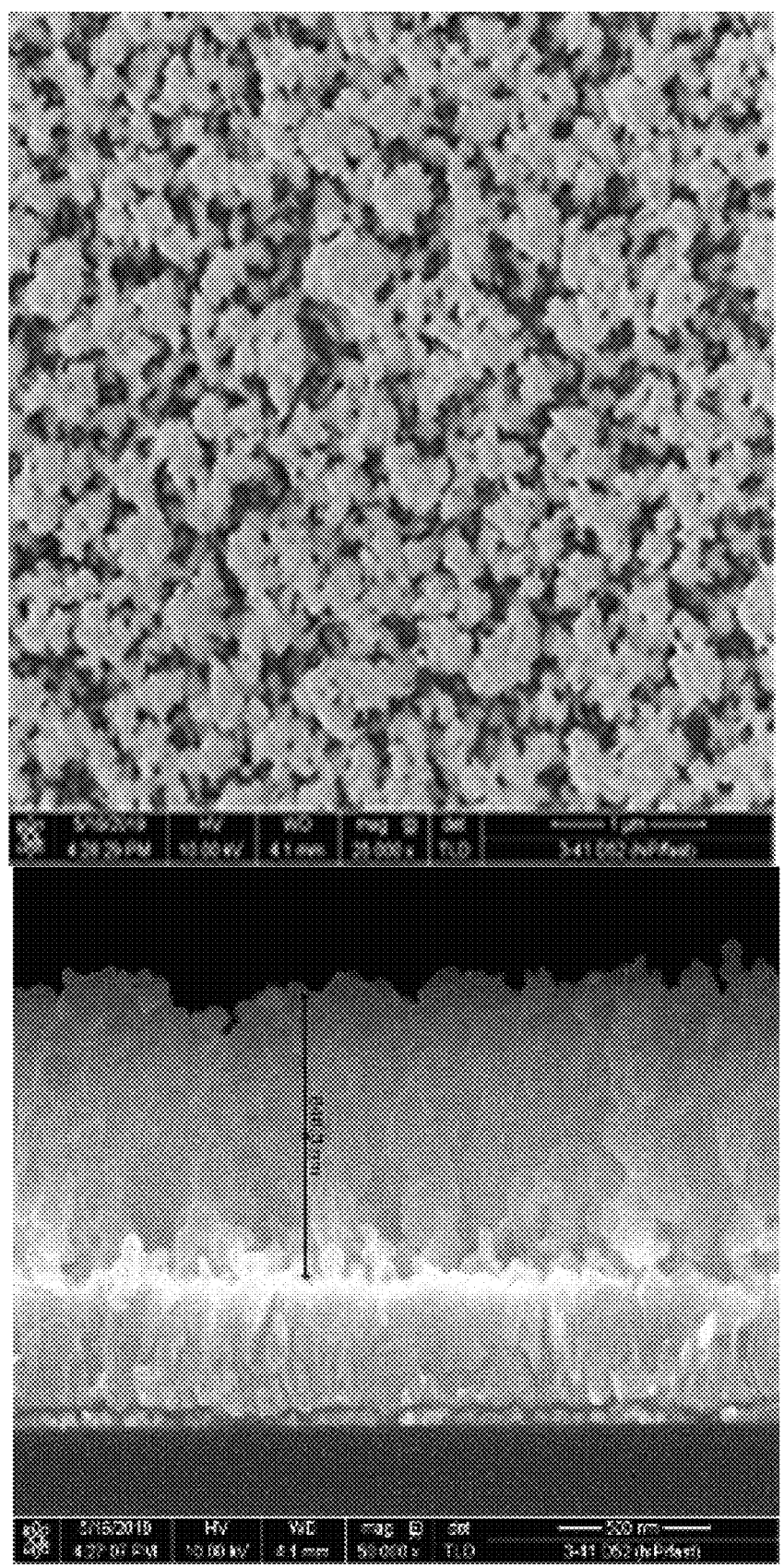
FIG. 7 shows an example precursor layer.

Four conditions were tested, Set A, corresponding to the example shown in FIG. 7; Set B, corresponding to the example shown in FIG. 8; Set C, corresponding to the example shown in FIG. 9; and Set D, corresponding to the example shown in FIG. 10. A carrier gas comprising helium directed vaporized $PbI_2$ toward the substrate. The $PbI_2$ was deposited in a layer consisting essentially of $PbI_2$ to a thickness in a range of 100-1000 nm. In Sets A and B the chamber pressure was maintained at about 1.5 Torr. In Sets C and D the chamber pressure was maintained at about 0.3 Torr. In Sets A and C the carrier gas flow rate was about 110 sccm (sccm—standard cubic centimeters per minute) and the deposition rate was about 0.25 um/min (250 nm/min). In Sets B and D, the carrier gas flow rate was about 110 sccm and the deposition rate was about 0.04 um/min (40 nm/min). Following deposition of the $PbI_2$ layer, the substrates were allowed to cool to room temperature before the next processing step.

Figure 8:
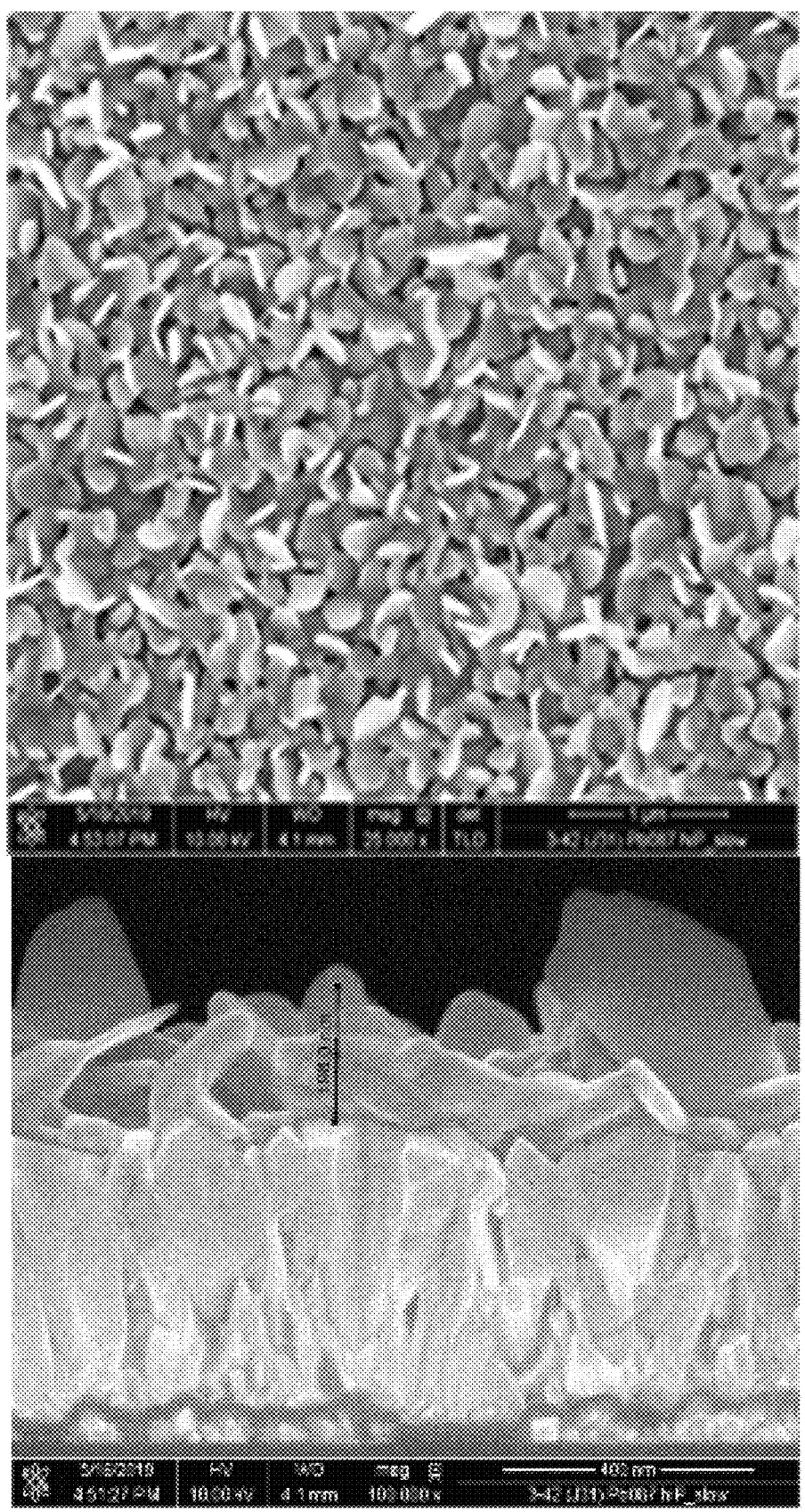
FIG. 8 shows an example precursor layer.
Figure 9:
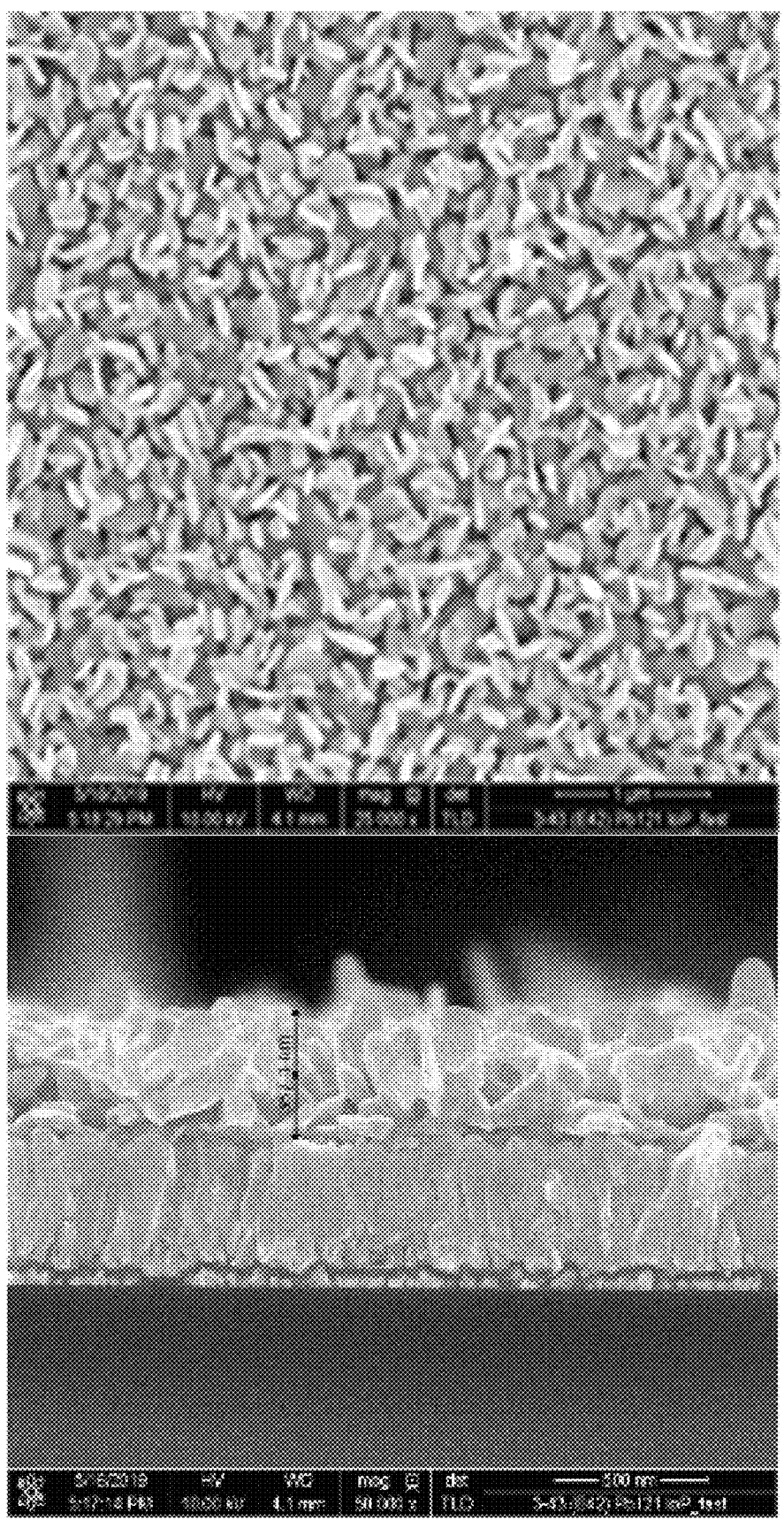
FIG. 9 shows an example precursor layer.
Figure 10:
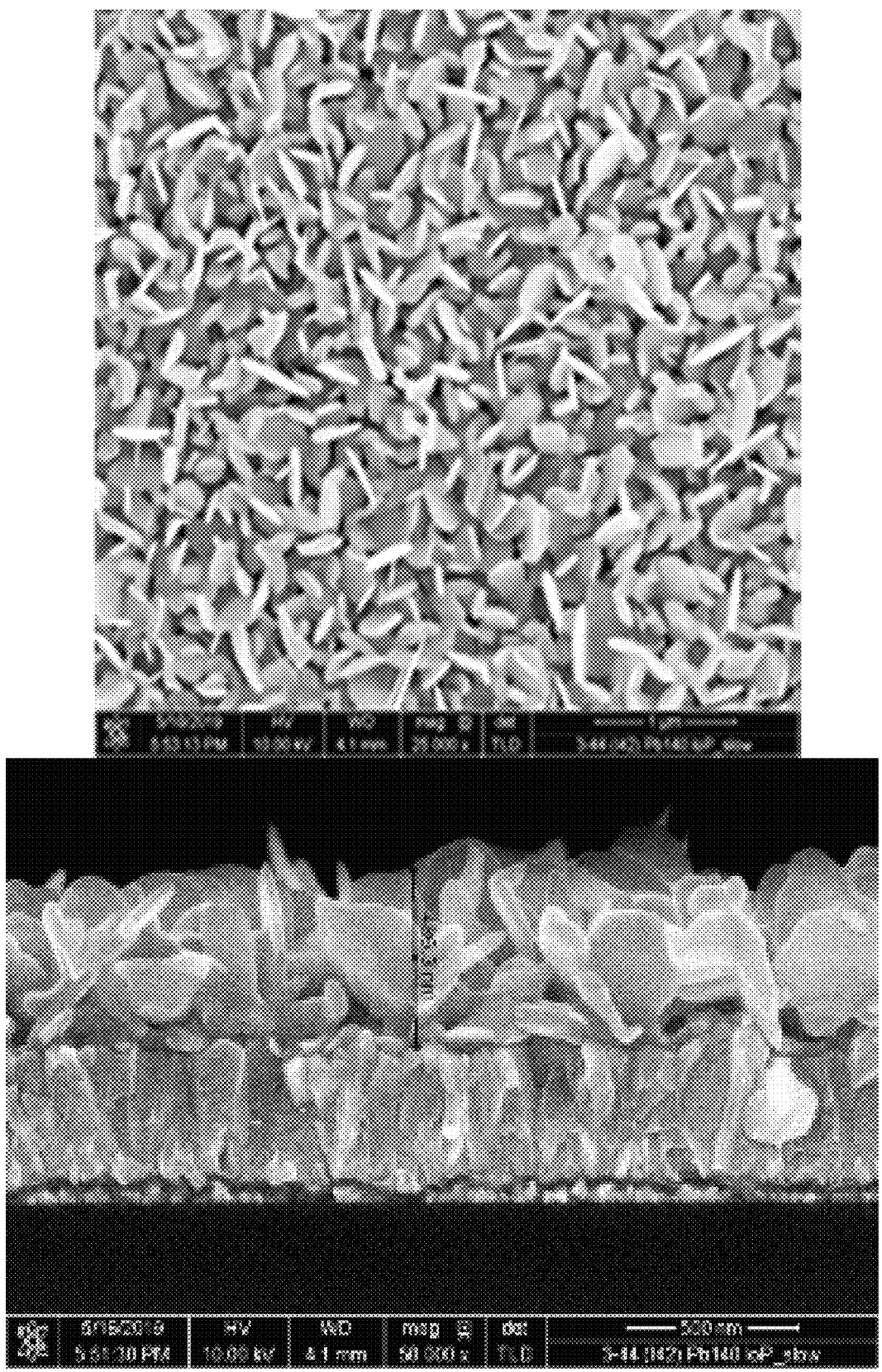
FIG. 10 shows an example precursor layer.

FIGS. 7-10 show SEM images of the precursor layer formed under each set (A, B, C, & D) of conditions. The upper panel in each of FIGS. 7-10 show images of the surface of the precursor layer with a scale bar of 1 micron (1000 nm). The lower panel in each of FIGS. 7-10 show cross-section images through the precursor layer and underlying layers. The scale bar for the lower panel of FIG. 8 is 400 nm, and the scale bar for the lower panel of FIGS. 7, 9, and 10 is 500 nm. As can be seen in the images, the precursor layers formed in sets B, C, and D demonstrate the favorable grain structure of closely-spaced petal-like crystal grain structures, with set D showing the substantially upright orientation of grains relative to the substrate stack. The resulting films showed good adhesion as demonstrated by pull-test.

Annealing $PbI_2$ Deposited by VTD and Converting to Perovskite.

Figure 11A:
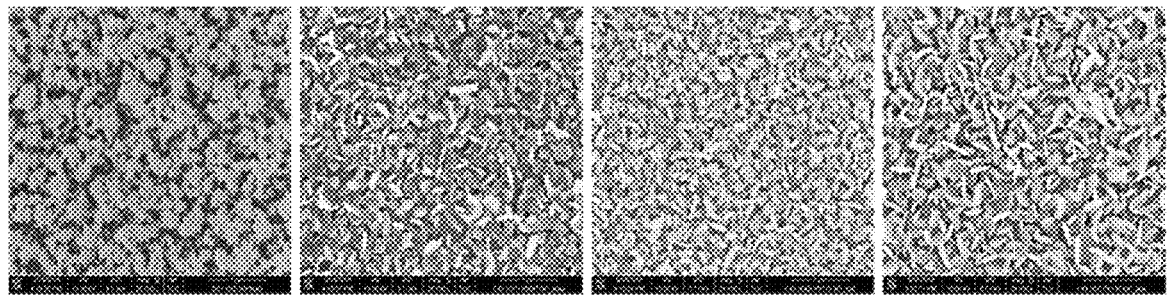
FIGS. 11A-11B show example precursor layers and corresponding perovskite layers.
Figure 11B:
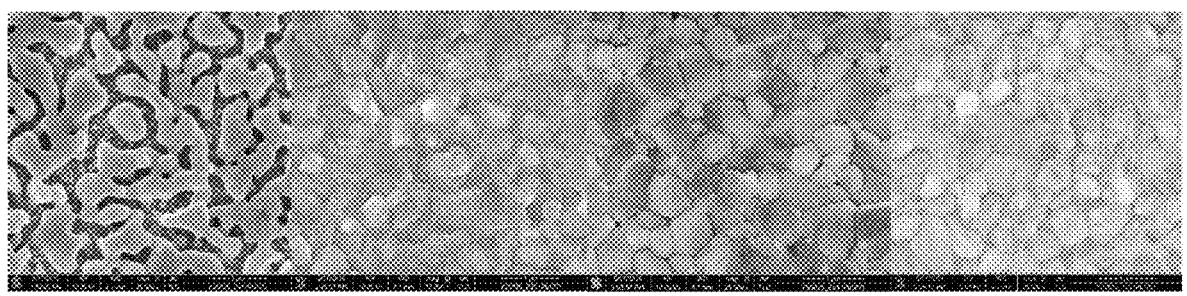

FIG. 11A shows four panels from left to right, depicting SEM images of the precursor layers corresponding, respectively, to sets A-D, described above. FIG. 11B shows four panels from left to right corresponding, respectively, to sets A-D, and depicting perovskite layers after the respective precursor layers are converted to perovskite under substantially the same conditions for exposure to a reactant comprising a second perovskite-forming material and heat treatment. The scale bar for the images depicted in FIGS. 11A and 11B is 1 micron (1000 nm). In this example, the second perovskite forming material comprises MAI, resulting in a MAPbI3 perovskite layer. As can be seen, the perovskite layer of set A is noncontiguous and irregular, indicating a poor quality layer. The layer shown for set D has features indicating a high quality layer that is regular, even, contiguous, and has large and similarly-sized perovskite grains.

Formation of high quality perovskite absorber material for material produced by the method of set D was further confirmed by high photoluminescence (PL) measurements.

Process Parameters and Resulting Film Quality.

Properties and factors relating to producing a good film quality in a perovskite layer include: pressure, temperature, humidity, material selection, crystal structure, grain size, adjacent layers, thickness, and/or porosity. When a precursor layer exhibits high porosity, or surface to volume ratio, subsequent exposure to the second precursor is enhanced, thereby producing a film in which the chemical reaction with the second precursor proceeds to completion quickly and simultaneously. The described VTD systems and methods are particularly effective for controlling material deposition parameters, thus providing a resulting layer with desired properties.

Figure 12:
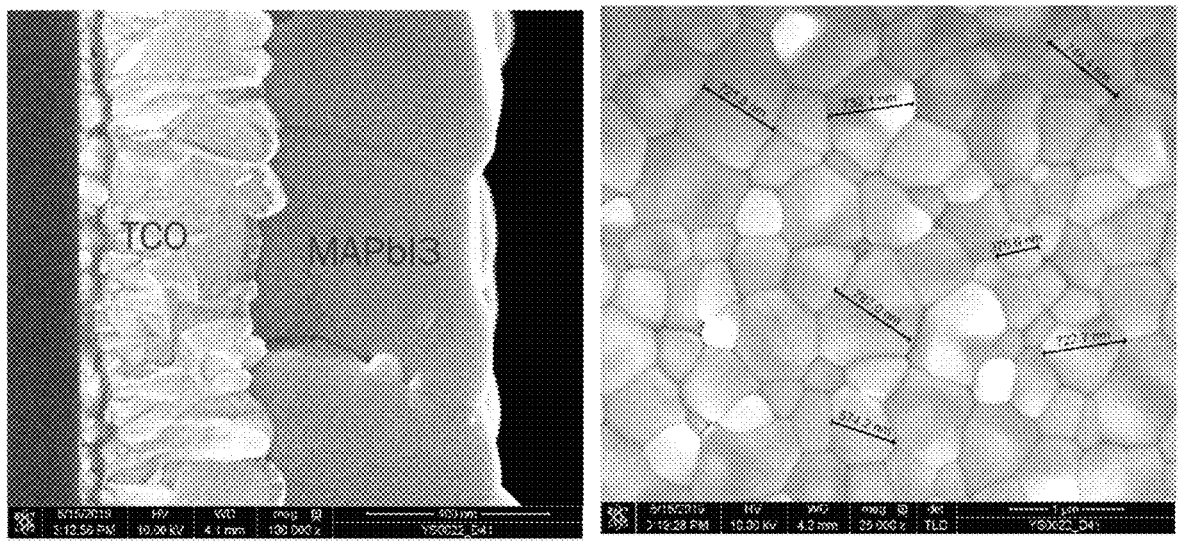
FIG. 12 shows a SEM image of a perovskite layer formed by the described methods.

FIG. 12 shows an image of a perovskite layer formed by the described methods. The converted perovskite grains are closely packed and large, with no pinholes or gaps. The panel on the left shows a cross-section SEM with a scale bar of 400 nm. The panel on the right shows a top surface SEM image of the perovskite layer with a scale bar of 1 micron.

Figure 13:
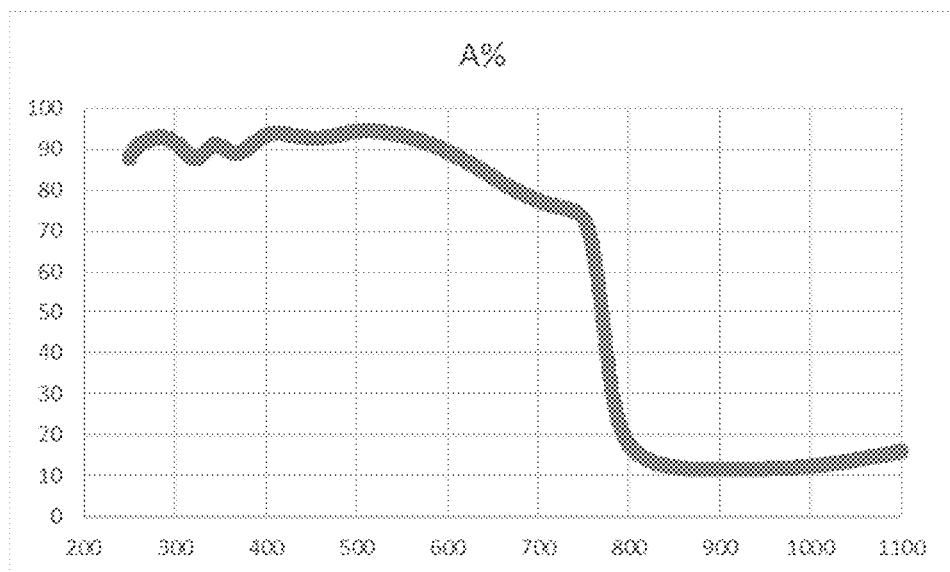
FIG. 13 shows absorbance by wavelength for a perovskite layer.
Figure 14:
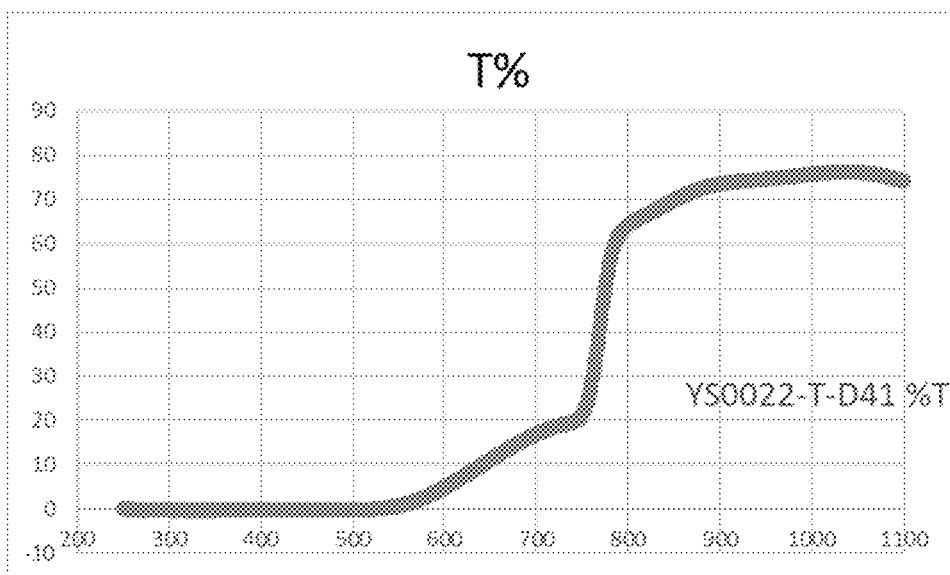
FIG. 14 shows optical transmission measurement of a perovskite layer.
Figure 15:
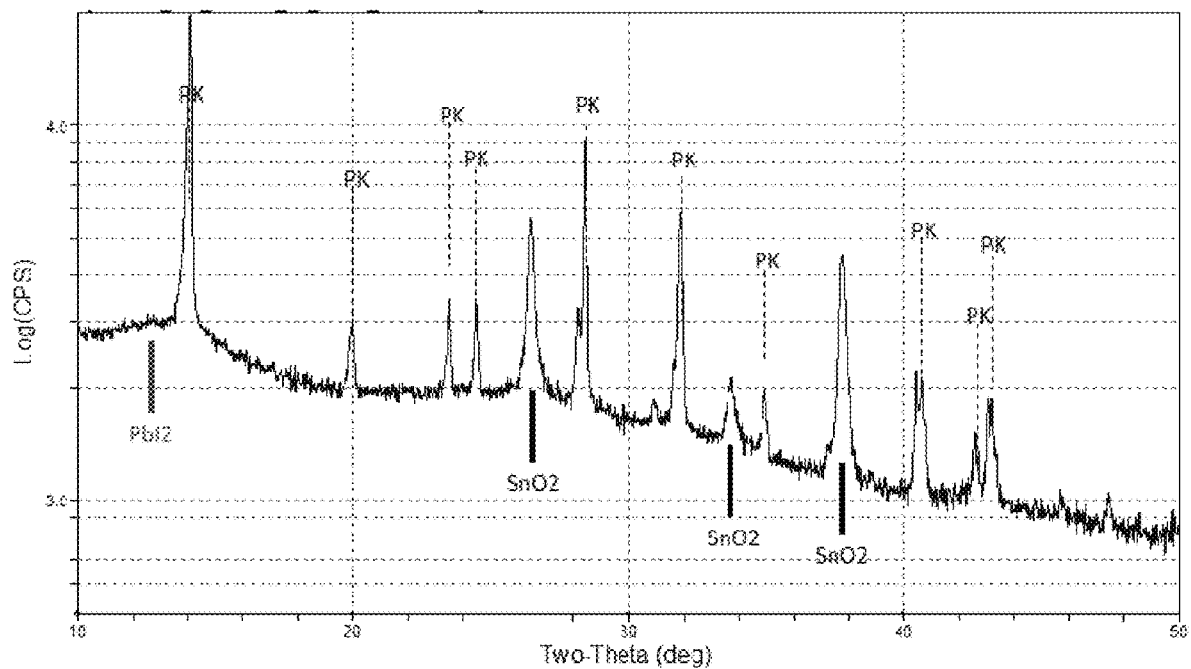
FIG. 15 shows X-ray diffraction measurement for a perovskite layer.

Turning now to FIGS. 13-15, measurements of absorber quality are shown. FIG. 13 shows absorbance by wavelength for an absorber formed by the described method. FIG. 14 shows optical transmission measurement of a perovskite layer on a fluorine-doped tin oxide (FTO) coated glass substrate. The position and sharp rise of the absorption edge is consistent with previously characterized perovskite layers. FIG. 15 shows X-ray diffraction measurement for the perovskite layer with characteristic perovskite (PK) peaks. The lack of a peak for $PbI_2$ indicates that conversion of the precursor layer to perovskite was complete, and there was not significant measurable $PbI_2$ residue.

Figure 16:
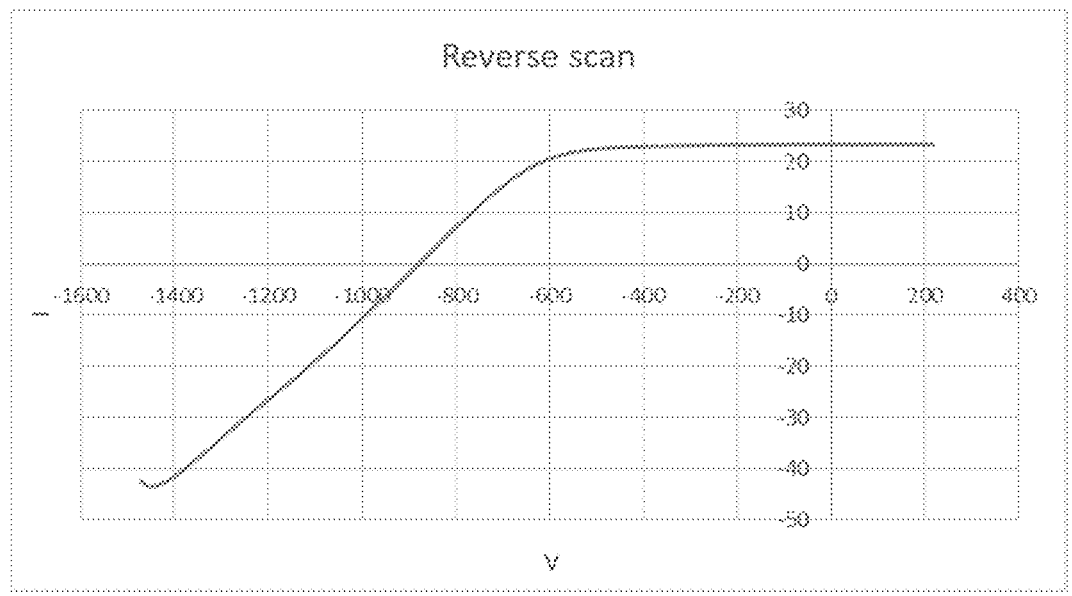
FIG. 16 shows current-voltage measurement by reverse scan on a perovskite device.

The perovskite film was integrated into a functional device. FIG. 16 shows an example of current-voltage (IV) measurement by reverse scan on a perovskite device having the structure: FTO/ETL/perovskite layer/HTL/Au back contact. The device achieved greater than 13% efficiency.

Figure 17:
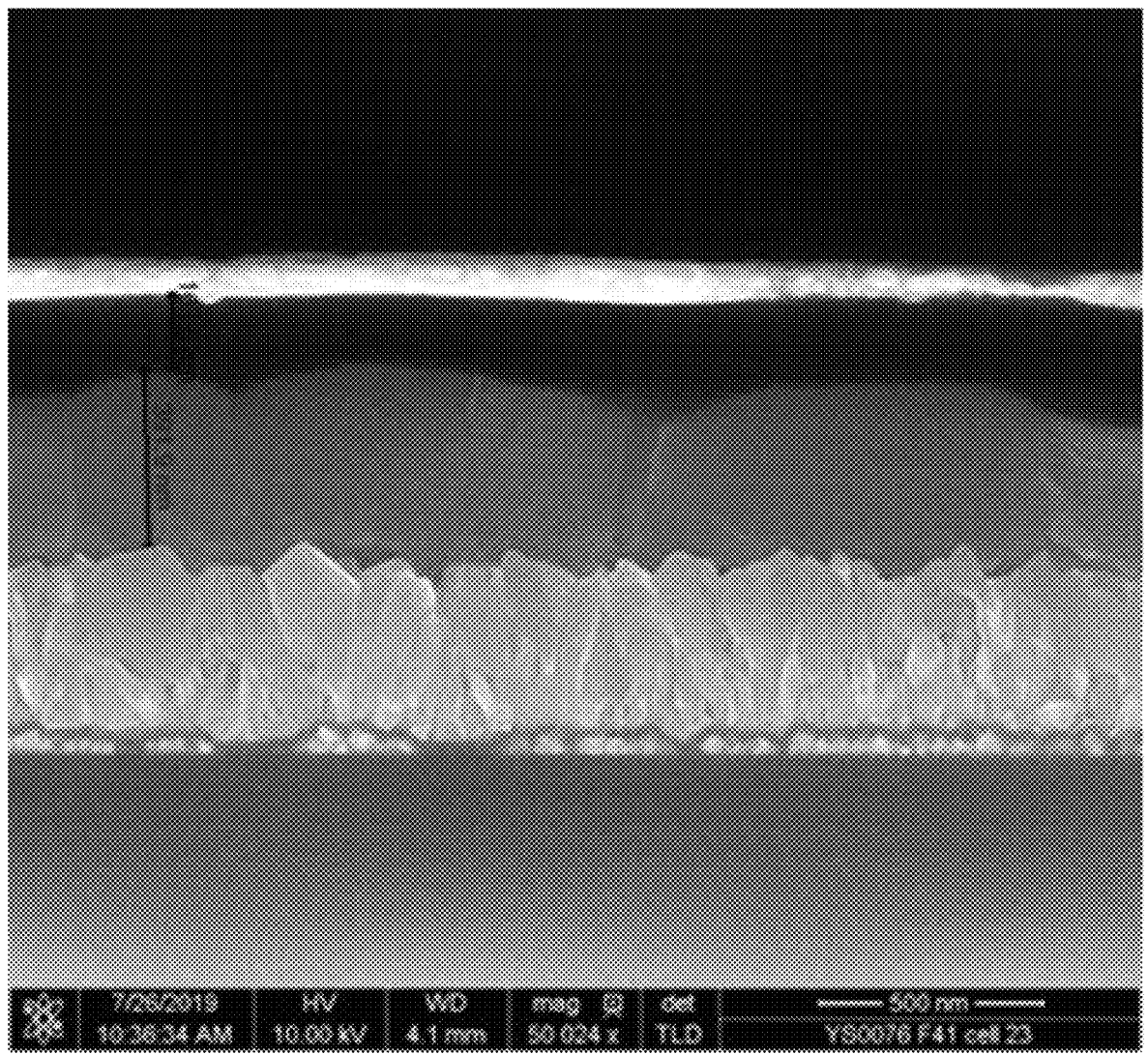
FIG. 17 shows a cross-section SEM image of a perovskite device.
Figure 18:
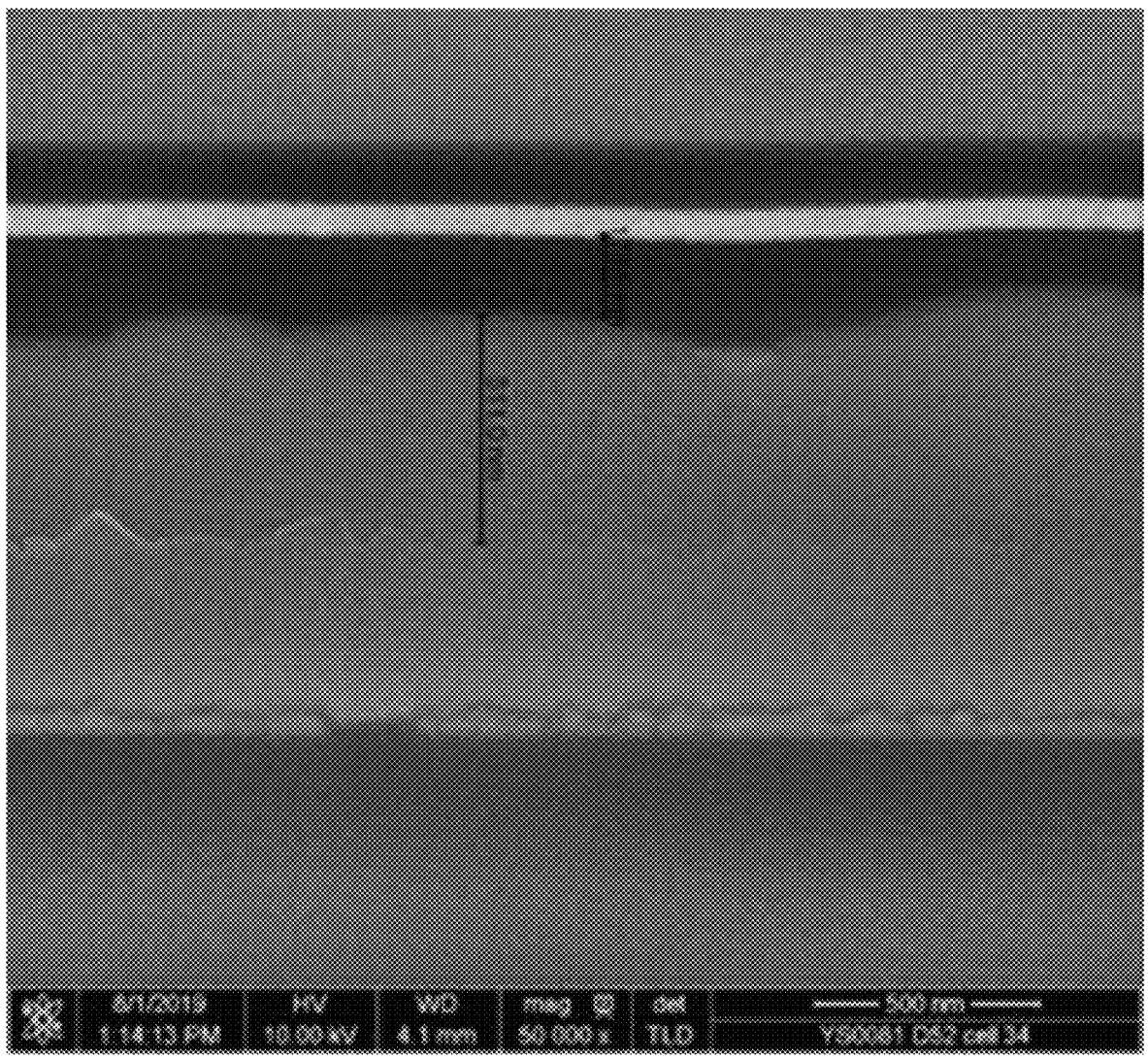
FIG. 18 shows a cross-section SEM image of a perovskite device.

FIGS. 17-18 show cross section SEM images of perovskite devices made by VTD of a $PbI_2$ first precursor layer with subsequent wet process conversion. The film is around 400 nm in thickness with average perovskite grain size greater than 500 nm in width. FIGS. 17 and 18 each have a scale bar of 500 nm.

Example—VTD of Cesium Bromide (CsBr)

Substrate stacks are prepared and at least one sample substrate stack is conveyed into a VTD chamber. A powder material comprising cesium bromide (CsBr) is used as a source material for the first perovskite precursor layer. The source material is heated to above 400° C. The chamber is maintained at a temperature in a range from 25° C. to 150° C. and at a pressure in a range from 0.1 Torr to 2.0 Torr. A carrier gas directs vaporized source material through a manifold toward a surface of the substrate stack with a carrier gas flow rate in a range from 80 sccm to 150 sccm to deposit a precursor layer comprising cesium bromide over the substrate stack in a layer having a thickness in a range of 100-2000 nm. In some embodiments, the source material further comprises tin and/or lead.

Example—VTD of Cesium Tin Iodide ($CsSnI_3$)

Substrate stacks are prepared and at least one sample substrate stack is conveyed into a VTD chamber. A powder material comprising cesium tin iodide ($CsSnI_3$) is used as a source material for the first perovskite precursor layer. The source material is heated to above 400° C. The chamber is maintained at a temperature in a range from 25° C. to 150° C. and at a pressure in a range from 0.1 Torr to 2.0 Torr. A carrier gas directs vaporized source material through a manifold toward a surface of the substrate stack with a carrier gas flow rate in a range from 80 sccm to 150 sccm to deposit a precursor layer comprising cesium tin iodide over the substrate stack in a layer having a thickness in a range of 100-2000 nm.

Example—VTD of Lead Bromide ($PbBr_2$)

Substrate stacks are prepared and at least one sample substrate stack is conveyed into a VTD chamber. A powder material comprising lead bromide ($PbBr_2$) is used as a source material for the first perovskite precursor layer. The source material is heated to above 400° C. The chamber is maintained at a temperature in a range from 25° C. to 150° C. and at a pressure in a range from 0.1 Torr to 2.0 Torr. A carrier gas directs vaporized source material through a manifold toward a surface of the substrate stack with a carrier gas flow rate in a range from 80 sccm to 150 sccm to deposit a precursor layer comprising lead bromide over the substrate stack in a layer having a thickness in a range of 100-2000 nm.

Processing steps in manufacturing a device may be accomplished using a system with one or more processors. According to the embodiments described herein, a processor means any device capable of executing machine readable instructions. Accordingly, each of the one or more processors may be a controller, an integrated circuit, a microchip, a computer, or any other computing device.

The one or more processors can be configured to execute logic or software and perform functions that control relative movement of the system and the layer stack, as well as the processing properties of the system, such as conveyor speed, temperature, pressure, and gas or material flow rate. Additionally, the one or more processors can be communicatively coupled to one or more memory components that can store the logic and/or input received by the one or more processors. The memory components described herein may be RAM, ROM, a flash memory, a hard drive, or any device capable of storing machine readable instructions.

As used herein, the term "communicatively coupled" means that the components are capable of exchanging data signals with one another such as, for example, electrical signals via conductive medium, electromagnetic signals via air, optical signals via optical waveguides, and the like.

Embodiments of the present disclosure comprise logic that includes machine readable instructions or an algorithm written in a programming language, including machine language that may be directly executed by the processor, or assembly language, object-oriented programming (OOP), scripting languages, or microcode, that may be compiled or assembled into machine readable instructions and stored on a machine readable medium. Alternatively, the logic or algorithm may be written in a hardware description language (HDL), such as logic implemented via either a field-programmable gate array (FPGA) configuration or an application-specific integrated circuit (ASIC), and their equivalents. Accordingly, the logic may be implemented in any conventional computer programming language, as pre-programmed hardware elements, or as a combination of hardware and software components.

The distributor assemblies and methods described herein provide substantial uniformity of vapor distribution. The distributor assemblies provided herein are scalable to coat large substrates, for example, substrates having dimensions greater than or equal to about 1 m in length and/or width, in a range between 0.5 to 2.0 m in length and width, or up to about 2 m in length and/or width.

According to the embodiments provided herein, a distributor assembly for a vapor transport deposition system can include a manifold, at least one vaporizer, at least one heater, and a slot or nozzle in the manifold. The at least one vaporizer can be supported on, connected to, or in fluid communication with, the manifold, and configured to vaporize a powder of a semiconductor material or semiconductor precursor material. The slot or nozzle in the manifold can be configured to direct vapors onto passing substrates.

According to the embodiments provided herein, a method of conducting vapor transport deposition (VTD) can include vaporizing a powder source of a material in a distributor assembly with a dedicated vaporizer configured to selectively heat the powder source so as to not substantially heat other components of the distributor assembly; and depositing the vaporized semiconductor material onto a substrate moving past the distributor assembly.

According to any of the embodiments provided above, the distributor assembly can be capable of delivering uniform vaporization and distribution of vapors simultaneously along a width of a substrate stack having a width from 1.0 to 2.0 meters. A width may be measured across a dimension perpendicular to an edge and perpendicular to a direction of conveyance.

According to any of the embodiments provided above, the distributor assembly can be configured to deposit a material onto the substrate stack at a deposition rate of between 0.05 to 1.75 microns per second. In an example, the deposition rate is at least 0.25 microns per second. In an example, the deposition rate is at least 0.5 microns per second. In an example, the deposition rate is at least 1 micron per second. In an example, the deposition rate is about 1.5 microns per second.

According to any of the embodiments provided above, the manifold can define an integrated housing that houses the vaporizer and the heater.

According to any of the embodiments provided above, the distributor assembly can include a plurality of slots or nozzles a slot or configured to direct vapors onto passing substrates.

According to the embodiments provided herein, a method of forming a perovskite precursor layer may include: providing a substrate stack in a deposition chamber, the substrate stack having a first charge transport layer on a first electrode; depositing a first perovskite-forming composition over the substrate stack in the deposition chamber by vapor transport deposition, by heating a source material to a temperature in a range of 375° C. to 550° C., using a carrier gas to direct vapor of the first perovskite forming material toward the substrate stack in the deposition chamber having a pressure in a range of 0.1 to 2.0 Torr; and forming a first precursor layer to a thickness of 100-2000 nm.

According to the embodiments provided herein, an intermediate structure for a perovskite photovoltaic device may comprise: a first electrode; a first charge transport layer on the first electrode; and a precursor layer on the first charge transport layer, the precursor layer having a thickness in a range of 100-2000 nm, with thickness deviation within the layer of less than 50%, and comprising at least one metal halide in a crystal matrix having a porosity greater than 35%.

According to the embodiments provided herein, a method for forming a perovskite-based photovoltaic device may include: depositing a first charge transport layer onto a first electrode; depositing a first perovskite-forming composition over the charge transport layer, by vapor transport deposition (VTD) with a carrier gas, under a set of VTD conditions, to form a precursor layer; contacting the precursor layer with a second perovskite-forming composition, converting the precursor layer to a perovskite by reacting the precursor layer with the second perovskite-forming composition, under a set of annealing conditions to form a photoactive absorber layer comprising a perovskite material, depositing a second charge transport layer, having an opposite polarity from the first charge transport layer, onto the perovskite material; and depositing an electrically conductive material onto the second charge transport layer to form a second electrode.

In some embodiments, a first perovskite-forming composition may include a group IV metal halide. In some embodiments, a first perovskite-forming composition may include one or more of: a lead halide and/or a tin halide. In some embodiments, a first perovskite-forming composition may include one or more of: lead iodide ($PbI_2$), lead bromide ($PbBr_2$), cesium bromide (CsBr), cesium lead iodide ($CsPbI_3$), cesium tin iodide ($CsSnI_3$), lead chloride ($PbCl_2$), tin iodide ($SnI_2$), and/or tin chloride ($SnCl_2$).

In an example, a first perovskite-forming composition comprises lead iodide.

In an example, a first perovskite-forming composition comprises lead bromide.

In an example, a first perovskite-forming composition comprises cesium bromide.

In some embodiments, the metal halide comprises one or more of: I, Br, or Cl.

In some embodiments, the metal halide comprises iodine and/or bromine.

In some embodiments, the metal halide comprises at least one Group IVA metal.

According to the embodiments provided herein, the precursor layer comprises at least one of: lead iodide ($PbI_2$), lead bromide ($PbBr_2$), cesium bromide (CsBr), cesium lead iodide ($CsPbI_3$), cesium tin iodide ($CsSnI_3$), lead chloride ($PbCl_2$), tin iodide ($SnI_2$), tin bromide ($SnBr_2$), and/or tin chloride ($SnCl_2$). In an example, the precursor layer comprises lead iodide ($PbI_2$).

In some embodiments, the precursor layer comprises a plurality of crystalline grains, wherein 30-100% of the grains have a size with at least one dimension having a length in a range of 200-800 nm.

In some embodiments, the set of VTD conditions comprise: a deposition chamber temperature in a range of 20° C. to 150° C.; a source material for the first perovskite-forming composition heated to a temperature in a range of 375° C. to 550° C.; a deposition chamber atmosphere comprising an inert carrier gas; and a deposition chamber pressure in a range of 0.05 Torr to 5.0 Torr. In some embodiments, the chamber pressure during the step of depositing the first precursor layer is in a range of 0.1 to 5.0 Torr, 0.1 to 2.0 Torr, 0.1 to 1.5 Torr, 0.25 to 1.5 Torr, 0.25 to 1.0 Torr, 0.25 to 0.75 Torr, or 0.25 to 0.50 Torr.

In an example, the source material for the first perovskite-forming composition comprises a powder.

In some embodiments, the source material is heated to a temperature in a range of 400° C. to 525° C. In an example, the source material is heated to a temperature in a range of 400° C. to 500° C. In an example, the source material is heated to a temperature in a range of 450° C. to 525° C. In an example, the source material is heated to a temperature in a range of 400° C. to 475° C.

In some embodiments, the substrate stack in the deposition chamber has a temperature in a range of 20° C. to 150° C.

In some embodiments, the carrier gas is inert. In some embodiments, the carrier gas comprises a noble gas. In an example, the carrier gas comprises helium. In an example, the carrier gas comprises argon. In an example, the carrier gas comprises nitrogen.

In an example, depositing the first precursor layer by VTD includes a deposition rate in a range of 0.01 to 1.50 microns per minute, a deposition duration in a range of 0.5 minutes to 5 minutes, and producing the precursor layer having a thickness of 100 nm to 2000 nm. In some embodiments, depositing the first precursor layer by VTD comprises a deposition rate in a range of 0.05 to 1.00 µm per minute, 0.05 to 0.75 µm per minute, 0.05 to 0.50 µm per minute, or 0.01 to 0.35 µm per minute.

According to the embodiments provided herein, an intermediate structure for a perovskite photovoltaic device may comprise a precursor layer on a first charge transport layer.

According to the embodiments provided herein, a precursor layer has a thickness in a range from 100 nm to 2000 nm. In some embodiments, the thickness of the precursor layer is in a range of 200-1500 nm, in a range of 300-1200 nm, in a range of 300-900 nm, and/or in a range of 350-800 nm. In some embodiments, the precursor layer has a thickness in a range of 200-1000 nm, 300-700 nm, 350-600 nm, or 400-500 nm. In an example, a precursor layer thickness is in a range of 300 to 1200 nanometers.

In some embodiments, the precursor layer has a thickness deviation within the layer of less than 50%, less than 40%, less than 30%, less than 20%, or less than 15%. In an example, a precursor layer has substantially no pin-holes and a minimum thickness of 100 nm throughout the precursor layer. In an example, a precursor layer has substantially no pin-holes and a minimum thickness of 200 nm throughout the precursor layer.

In some embodiments, the precursor layer comprises a plurality of metal halide crystal grain structures, wherein: the grain structures have a height, normal to the surface of the substrate stack, and a width, parallel to the surface of the substrate stack, and an average grain width is less than a third of an average grain height. In an example, the grain structures comprise lead iodide.

In some embodiments, the precursor layer has a porosity in a range from 35% to 65%, in a range from 40% to 60%, and/or in a range from 45% to 55%. In an example, the porosity is greater than 40%.

In some embodiments, a second perovskite-forming composition, includes at least one of a cesium (Cs) cation, a rubidium (Rb) cation, a methylammonium (MA) compound, and/or a formamidinium (FA) compound.

In an example, the set of annealing conditions comprise: an annealing chamber pressure in a range of 0.1 Torr to 1000 Torr, an annealing duration in a range of 1 to 90 minutes, a humidity in a range of 40-60%, and an annealing chamber temperature in a range of 50-200° C. In some embodiments, the pressure during the annealing step is in a range of 0.1 to 100.0 Torr, 0.1 to 20.0 Torr, 0.1 to 5.0 Torr, 0.1 to 2.0 Torr, or 0.25 to 1.5 Torr.

According to the embodiments provided herein, a first charge transport layer for a photovoltaic device may comprise a hole-transport layer or an electron-transport layer, and a second charge transport layer may comprise an electron-transport layer or a hole-transport layer, provided that the first and second charge transport layers have opposite charge polarity.

According to the embodiments provided herein, a method for forming a perovskite-based photovoltaic device, may include: depositing a first hole-transport or electron-transport layer onto a first electrode; depositing, by vapor transport deposition (VTD) under a set of VTD conditions, a first perovskite-forming composition, including a lead halide or a tin halide, onto the first hole-transporting or electron-transporting material to form a precursor layer; depositing a second perovskite-forming composition; converting the precursor layer to a perovskite by reacting the precursor layer with the second perovskite-forming composition, under a set of annealing conditions to form a photoactive layer comprising a perovskite material on the first hole-transport or electron-transport layer; depositing a second hole-transport or electron-transport layer, which has an opposite polarity from the first hole-transport or electron-transport layer, onto the perovskite material; and depositing an electrically conductive material onto the second hole-transporting or electron-transport layer to form a second electrode.

In some embodiments, the set of VTD conditions comprise: a chamber temperature in a range of 20° C. to 150° C., an atmosphere comprising an inert carrier gas, a metal halide source heated to a temperature in a range of 375° C. to 550° C., a deposition rate in a range of 0.10 to 1.00 microns per minute, and a pressure in a range of 0.1 Torr to 5 Torr. In some embodiments, the precursor layer is deposited at a thickness 400-500 nm or thicker, with a deposition duration in a range of 0.5 minutes to 5 minutes.

In some embodiments, a method of making a perovskite absorber layer of a photovoltaic device includes providing an intermediate structure, with a metal halide precursor layer formed from a first perovskite-forming composition; exposing the intermediate structure to a second perovskite-forming composition; and annealing the intermediate structure with the second perovskite-forming composition. In some embodiments, a second perovskite-forming composition, includes at least one of: a cesium (Cs) cation, a rubidium (Rb) cation, a methylammonium (MA) compound (I or Br), or a formamidinium (FA) compound; the set of annealing conditions may include: a pressure in a range of 0.1 Torr to 1000 Torr, an annealing duration in a range of 10 minutes to 90 minutes, a humidity in a range of 45-60%, and a temperature in a range of 50° C. to 150° C. In some embodiments, the step of exposing the intermediate structure to the second perovskite-forming composition includes contacting the precursor layer with a vapor comprising the second perovskite-forming composition. In some embodiments, exposing the intermediate structure to the second perovskite-forming composition comprises depositing material comprising the second perovskite-forming composition in a layer over the precursor layer.

In some embodiments, the method produces a perovskite absorber layer having a thickness of about 400 nm, with average perovskite grain size greater than 500 nm in width. In some embodiments, the method produces a perovskite absorber layer having a thickness in a range of 200-800 nm. In some embodiments, the method produces a perovskite absorber layer having perovskite grains with an average perovskite grain width greater than an average perovskite grain height. In some embodiments, the method produces a perovskite absorber layer having substantially no pin holes or gaps. In some embodiments, the method produces a perovskite absorber layer having a thickness greater than 200 nm. In some embodiments, the method produces a perovskite absorber layer having a thickness in a range of 200 nm to 10000 nm. In some embodiments, the method produces a perovskite absorber layer having a thickness in a range of 200 nm to 6000 nm, or in a range of 300 nm to 3000 nm.

Certain embodiments of the devices, apparatuses, and methods disclosed herein are defined in the above examples. It should be understood that these examples, while indicating particular embodiments, are given by way of illustration only. From the above discussion and these examples, one skilled in the art can ascertain the essential characteristics of this disclosure, and without departing from the spirit and scope thereof, can make various changes and modifications to adapt the compositions and methods described herein to various usages and conditions. Various changes may be made and equivalents may be substituted for elements thereof without departing from the essential scope of the disclosure. In addition, many modifications may be made to adapt a particular situation or material to the teachings of the disclosure without departing from the essential scope thereof.

What is claimed is:

1. A method of forming a perovskite precursor layer comprising:
   providing a substrate stack in a deposition chamber, the substrate stack having a first charge transport layer on an electrode;
   depositing a first perovskite-forming composition on the substrate stack in the deposition chamber by a vapor transport deposition (VTD) process, comprising:
   heating a source material to a temperature in a range of 375° C. to 550° C., wherein the source material comprises at least one of: lead iodide ($PbI_2$), lead bromide ($PbBr_2$), cesium bromide (CsBr), cesium lead iodide ($CsPbI_3$), cesium tin iodide ($CsSnI_3$), lead chloride ($PbCl_2$), tin iodide ($SnI_2$), tin bromide ($SnBr_2$), or tin chloride ($SnCl_2$);
   providing a vapor curtain to direct vapor of the source material using a carrier gas toward the substrate stack in the deposition chamber, wherein the vapor curtain has a width greater than 1 meter, the deposition chamber having a pressure in a range of 0.1 to 2.0 Torr; and
   forming the precursor layer, at a deposition rate in a range of 0.01 to 1.50 μm per minute, to a thickness of 100-2000 nm, wherein the precursor layer comprises a plurality of metal halide crystal grain structures, wherein: the grain structures have a height, normal to the surface of the substrate stack, and a width, parallel to the surface of the substrate stack, and an average grain width is less than a third of an average grain height.

2. The method of claim 1, wherein:
   the deposition chamber has a pressure in a range of 0.1 to 1.0 Torr;
   the deposition chamber has a temperature in a range of 20° C. to 150° C.;
   the source material is heated to a temperature in a range of 400° C. to 525° C.; and
   a carrier gas flow rate in a range from 80 sccm to 150 sccm.

3. The method of claim 1, wherein the source material is provided as a powder.

4. The method of claim 1, wherein the precursor layer comprises at least one metal halide in a crystal matrix having a porosity in a range from 35% to 65%.

5. The method of claim 1, wherein forming the precursor layer to the thickness comprises forming the precursor layer to a thickness in a range of 200-1500 nm.

6. The method of claim 1, wherein the precursor layer comprises at least one of: lead iodide ($PbI_2$), lead bromide ($PbBr_2$), cesium bromide (CsBr), or cesium tin iodide ($CsSnI_3$), in a crystal matrix having a porosity greater than 35%.

7. The method of claim 1, wherein the precursor layer comprises a plurality of lead iodide crystal grain structures, wherein: the grain structures have a height, normal to the surface of the substrate stack, and a width, parallel to the surface of the substrate stack, and at least a quarter of grain structures of the precursor layer have a height that is in a range of 200 nm to 700 nm and a width that is less than 100 nm.

8. The method of claim 1, wherein the deposition rate is in a range of 0.05 to 0.50 µm per minute.

9. The method of claim 1, wherein the carrier gas comprises at least one of: argon, helium, or nitrogen.

10. The method of claim 1, wherein the precursor layer comprises a plurality of crystalline grains, and wherein 30-100% of the grains have a size with at least one dimension having a length in a range of 200-800 nm.

11. A method of forming a perovskite precursor layer for a photovoltaic device, the method comprising:
   providing a substrate stack in a deposition chamber, the substrate stack having a first charge transport layer on an electrode;
   depositing a first perovskite-forming composition on the substrate stack in the deposition chamber by a vapor transport deposition (VTD) process, comprising:
   heating a source material to a temperature in a range of 400° C. to 525° C.;
   providing a vapor curtain to direct vapor of the source material using a carrier gas toward the substrate stack in the deposition chamber, wherein:
   the deposition chamber has a pressure in a range of 0.1 to 1.0 Torr;
   the deposition chamber has a temperature in a range of 20° C. to 150° C.;
   the source material comprises at least one of: lead iodide ($PbI_2$), lead bromide ($PbBr_2$), cesium bromide (CsBr), cesium lead iodide ($CsPbI_3$), cesium tin iodide ($CsSnI_3$), lead chloride ($PbCl_2$), tin iodide ($SnI_2$), tin bromide ($SnBr_2$), or tin chloride ($SnCl_2$);
   a carrier gas flow rate is in a range from 80 sccm to 150 sccm; and
   forming the precursor layer to a thickness in a range of 200 nm to 1500 nm,
   whereby the precursor layer comprises a plurality of metal halide crystal grain structures.

12. The method of claim 11, wherein the metal halide grain structures have a height, normal to the surface of the substrate stack, and a width, parallel to the surface of the substrate stack, and at least a quarter of grain structures of the precursor layer have a height that is in a range of 200 nm to 700 nm, and a width that is less than 100 nm.

* * * * *